(12) United States Patent
Bauchart et al.

(10) Patent No.: US 12,550,284 B2
(45) Date of Patent: Feb. 10, 2026

(54) RACK SYSTEM FOR A DATA CENTER

(71) Applicant: OVH, Roubaix (FR)

(72) Inventors: Gregory Francis Louis Bauchart, Wattrelos (FR); Alexandre Alain Jean-Pierre Meneboo, Harnes (FR); Ali Chehade, Moncheaux (FR)

(73) Assignee: OVH, Roubaix (FR)

( * ) Notice: Subject to any disclaimer, the term of this patent is extended or adjusted under 35 U.S.C. 154(b) by 714 days.

(21) Appl. No.: 17/887,805

(22) Filed: Aug. 15, 2022

(65) Prior Publication Data
US 2023/0069508 A1    Mar. 2, 2023

(30) Foreign Application Priority Data
Aug. 30, 2021  (EP) ..................................... 21306168

(51) Int. Cl.
*E06B 3/96*    (2006.01)
*H05K 7/14*    (2006.01)
*B65D 19/00*   (2006.01)

(52) U.S. Cl.
CPC ........... *H05K 7/1488* (2013.01); *B65D 19/00* (2013.01)

(58) Field of Classification Search
CPC ..................................................... B65D 19/00
USPC ....................................................... 52/126.6
See application file for complete search history.

(56) References Cited

U.S. PATENT DOCUMENTS

| 7,278,273 | B1   | 10/2007 | Whitted et al. |           |
|-----------|------|---------|----------------|-----------|
| 9,104,387 | B1 * | 8/2015  | Eichelberg     | A47B 46/00 |
| 9,661,778 | B1 * | 5/2017  | Ross           | H05K 7/20745 |
| 10,098,248 | B1 * | 10/2018 | Klinger       | H05K 7/1495 |
| 10,182,516 | B2 * | 1/2019  | Martini        | H05K 7/20172 |
| 10,426,056 | B1 * | 9/2019  | McNair         | H05K 7/1497 |
| 10,499,532 | B1 * | 12/2019 | Keehn          | E04F 15/02405 |
| 11,490,541 | B2 * | 11/2022 | Mason          | B65D 90/008 |

(Continued)

FOREIGN PATENT DOCUMENTS

CN   111788874 A   10/2020
EP     3259534 A1  12/2017
(Continued)

OTHER PUBLICATIONS

Office Action with regard to the counterpart CN Patent Application No. 2022110434266 issued Oct. 31, 2024.
(Continued)

*Primary Examiner* — James J Buckle, Jr.
(74) *Attorney, Agent, or Firm* — BCF LLP

(57) ABSTRACT

A rack system for a data center includes: a plurality of racks configured to house electronic equipment therein, at least one rack column being formed by at least some of the racks being disposed above one another, each rack having a rack depth measured in a front-to-rear direction; and at least one supporting pedestal disposed below the at least one rack column in order to support the at least one rack column, the at least one supporting pedestal being configured to be positioned on a ground surface of the data center to distribute a load of the at least one rack column on the ground surface, each of the at least one supporting pedestal having a pedestal depth measured in the front-to-rear direction, the pedestal depth being greater than the rack depth, a ratio of the pedestal depth over the rack depth being between 1.2 and 2.5 inclusively.

14 Claims, 14 Drawing Sheets

(56) References Cited

U.S. PATENT DOCUMENTS

| | | | | |
|---|---|---|---|---|
| 2011/0260591 A1* | 10/2011 | Peng | ............... | H05K 5/0234 |
| | | | | 312/249.8 |
| 2011/0260593 A1* | 10/2011 | Peng | ............... | H05K 7/1488 |
| | | | | 312/293.3 |
| 2012/0104919 A1* | 5/2012 | Wu | ............... | H05K 7/1497 |
| | | | | 312/334.28 |
| 2012/0200992 A1* | 8/2012 | Schmitt | ............ | H05K 7/1497 |
| | | | | 361/679.02 |
| 2015/0076975 A1* | 3/2015 | Peng | ............. | H05K 7/20218 |
| | | | | 312/236 |
| 2015/0334866 A1* | 11/2015 | Bailey | ............. | H05K 7/183 |
| | | | | 312/223.2 |
| 2015/0334879 A1 | 11/2015 | Fricker | | |
| 2016/0079741 A1* | 3/2016 | Englert | ............ | H05K 7/1492 |
| | | | | 361/624 |
| 2016/0107793 A1* | 4/2016 | Jiang | ............... | B65D 19/42 |
| | | | | 206/386 |
| 2016/0273903 A1* | 9/2016 | Cattoen | ............ | G01B 21/04 |
| 2017/0181314 A1 | 6/2017 | Leigh et al. | | |
| 2019/0239370 A1* | 8/2019 | Chen | ............... | H05K 5/0234 |
| 2019/0261534 A1 | 8/2019 | Jochim et al. | | |
| 2019/0310020 A1 | 10/2019 | Klaba et al. | | |

FOREIGN PATENT DOCUMENTS

| | | |
|---|---|---|
| EP | 3550245 A1 | 10/2019 |
| WO | 2016131138 A1 | 8/2016 |

OTHER PUBLICATIONS

Extended European Search Report with regard to the EP Patent Application No. 21306168.2 completed Feb. 8, 2022.

* cited by examiner

RACK SYSTEM FOR A DATA CENTER

CROSS-REFERENCE

The present applications claims priority from European Patent Application No. 21306168.2, filed Aug. 30, 2021, the entirety of which is incorporated by reference herein.

FIELD OF TECHNOLOGY

The present technology relates to rack systems for data centers.

BACKGROUND

Data centers house multiple server racks for storing servers therein. In particular, the racks are usually arranged in multiple rows in such a way as to optimize the amount of racks that can fit within the data center while providing a favorable configuration for cooling the servers and other electronic equipment within the racks.

In some cases, it has been contemplated to stack server racks atop one another in order to more efficiently use the vertical space within the data center. While this can be advantageous, the amount of racks that can be stacked atop one another is generally limited by the load that the bottommost rack of a stack of racks can safely support. One solution that has been contemplated is, rather than stacking the racks on top of each other, to build a supporting frame that supports each one of the server racks of a given row of racks such that the supporting frame supports the weight of the racks. However, this can be limiting as the supporting frame must be built and installed before the racks are positioned therein, and thus the supporting frame is dimensioned according to a predetermined number of racks that the supporting frame is intended to support. As such, this solutions offers little adaptability to the installation of the server racks within the data center as the final configuration of the racks must be predetermined ahead of time.

Furthermore, when server racks are stacked above one another, different conduits (e.g., electrical conduits, liquid conduits) may need to be installed to support the operation of the servers and other supporting equipment (e.g., networking equipment, power supply equipment, cooling equipment). However, routing these conduits throughout the data center also requires providing sufficient support to fix the conduits in place. In some cases, this may result in the conduits being supported by the server racks, which further adds to the load that is to be supported by the bottommost one of the racks when they are stacked atop one another thus exacerbating the problem.

There is therefore a desire for a rack system which can alleviate at least some of these drawbacks.

SUMMARY

It is an object of the present technology to ameliorate at least some of the inconveniences present in the prior art.

According to one aspect of the present technology, there is provided a rack system for a data center. The rack system comprises: a plurality of server racks configured to house servers therein, each server rack being configured to store the servers which are accessible via a front side of the server rack, each server rack defining at least one housing section for receiving one or more of the servers therein; at least one rack column being formed by at least some of the server racks being disposed above one another, each server rack of the at least one rack column having a rack depth measured in a front-to-rear direction extending from the front side to a rear side of the server rack; and at least one supporting pedestal disposed below the at least one rack column in order to support the at least one rack column, the at least one supporting pedestal being configured to be positioned on a ground surface of the data center to distribute a load of the at least one rack column on the ground surface, each of the at least one supporting pedestal having a pedestal depth measured in the front-to-rear direction, the pedestal depth being greater than the rack depth, a ratio of the pedestal depth over the rack depth being between 1.2 and 2.5 inclusively.

In some embodiments, each of the at least one supporting pedestal is made of concrete.

In some embodiments, each of the at least one supporting pedestal is a single integral component.

In some embodiments, each of the at least one supporting pedestal defines a pedestal channel extending below a corresponding one of the at least one rack column; the pedestal channel extends generally laterally; and the pedestal channel extends along at least a majority of a width of the at least one supporting pedestal.

In some embodiments, the pedestal channel is open from a top thereof.

In some embodiments, the rack system further comprises at least one conduit for servicing the servers stored by at least some of the server racks, the at least one conduit extending within the pedestal channel of the at least one supporting pedestal.

In some embodiments, the pedestal channel is a first pedestal channel; and each of the at least one supporting pedestal defines a second pedestal channel extending generally parallel to the first pedestal channel.

In some embodiments, the first and second pedestal channels are configured to allow fluid flow therein such that the fluid is in contact with inner surfaces of the at least one supporting pedestal.

In some embodiments, each of the at least one supporting pedestal comprises: a lower base portion defining the pedestal depth; and an upper pillar portion extending upward from the lower base portion, the upper pillar portion having a pillar depth measured in the front-to-rear direction, the pillar depth being less than the pedestal depth.

In some embodiments, the upper pillar portion comprises two pillar walls extending upwardly from the lower base portion and spaced apart from one another in the front-to-rear direction; and a distance between the two pillar walls is approximately equal to the rack depth.

In some embodiments, a bottom surface of the lower base portion extends along the entirety of the depth of the at least one supporting pedestal and the width of the at least one supporting pedestal.

In some embodiments, the at least one rack column includes a first rack column and a second rack column, the first rack column being laterally adjacent to the second rack column; the rack system further comprises a rack row formed by the first and second rack columns; the at least one supporting pedestal includes a first supporting pedestal and a second supporting pedestal, the first supporting pedestal supporting the first rack column, the second supporting pedestal supporting the second rack column.

In some embodiments, the at least one rack column includes a third rack column and a fourth rack column, the third rack column being laterally adjacent to the fourth rack column; the rack row is a first rack row, the rack system further comprising a second rack row extending parallel to the first rack row, the second rack row being formed by the third and fourth rack columns, the third and fourth rack columns being spaced from the first and second rack columns; and the at least one supporting pedestal includes a third supporting pedestal and a fourth supporting pedestal, the third supporting pedestal supporting the third rack column, the fourth supporting pedestal supporting the fourth rack column.

In some embodiments, the rack system further comprises: at least one floor panel extending between the first rack row and the second rack row, the at least one floor panel being disposed vertically higher than a bottom surface of the supporting pedestals.

In some embodiments, each server rack of the at least one rack column has a rack width measured in a lateral direction; and each of the at least one supporting pedestal has a pedestal width measured in the lateral direction, the pedestal width being approximately the same as the rack width.

According to another aspect of the present technology, there is provided a server rack assembly for a data center, comprising: a stackable chassis configured to support a plurality of servers, the stackable chassis comprising: a left side chassis portion defining a left end of the stackable chassis and a right side chassis portion laterally spaced apart from the left side chassis portion, the right side chassis portion defining a right end of the stackable chassis, the stackable chassis being configured to support the servers between the left and right side chassis portions, each of the left and right side chassis portions comprising: front and rear upper supports configured to support an upper server rack assembly, the front and rear upper supports being spaced apart from one another in a front-to-rear direction of the server rack; and front and rear lower supports configured to be supported by a lower server rack assembly, the front and rear lower supports being spaced apart from one another in the front-to-rear direction, the front and rear lower supports being disposed vertically lower than the front and rear upper supports.

In some embodiments, the server rack assembly further comprises a server rack having a frame and defining at least one housing section for housing the plurality of servers therein; and the server rack is connected to the stackable chassis, the server rack being disposed between the left and right side chassis portions.

In some embodiments, the stackable chassis further comprises at least one lower chassis member extending laterally and interconnecting the left and right side chassis portions, the at least one lower chassis member being disposed below the server rack.

In some embodiments, each of the left and right side chassis portions further comprises: a front upright member connected to the front upper support and the front lower support; a rear upright member extending parallel to the front upright member, the rear upright member being connected to the rear upper support and the rear lower support; an upper longitudinal member extending between the front and rear upper supports; and a lower longitudinal member extending between the front and rear lower supports.

In some embodiments, each of the left and right side chassis portions further comprises at least one lateral connecting flange configured to be connected to a laterally adjacent server rack assembly.

Embodiments of the present technology each have at least one of the above-mentioned objects and/or aspects, but do not necessarily have all of them. It should be understood that some aspects of the present technology that have resulted from attempting to attain the above-mentioned objects may not satisfy these objects and/or may satisfy other objects not specifically recited herein.

Additional and/or alternative features, aspects and advantages of embodiments of the present technology will become apparent from the following description, the accompanying drawings and the appended claims.

It is to be understood that terms relating to the position and/or orientation of components such as "upper", "lower", "top", "bottom", "front", "rear", "left", "right", are used herein to simplify the description and are not intended to be limitative of the particular position/orientation of the components in use.

BRIEF DESCRIPTION OF THE DRAWINGS

For a better understanding of the present technology, as well as other aspects and further features thereof, reference is made to the following description which is to be used in conjunction with the accompanying drawings, where.

DETAILED DESCRIPTION

Figure 1:
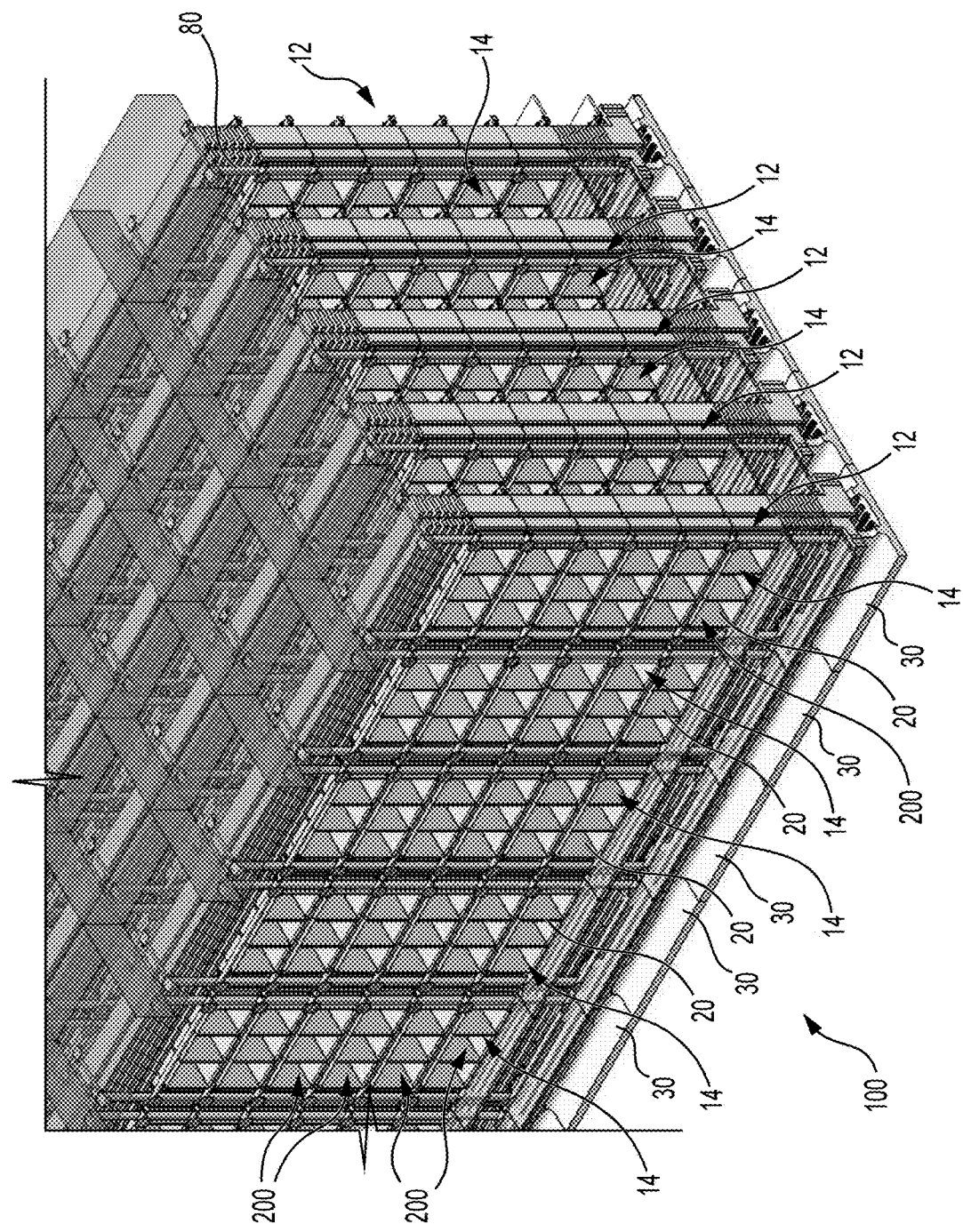
FIG. 1 is a perspective view of a rack system for a data center according to an embodiment of the present technology.
Figure 2:
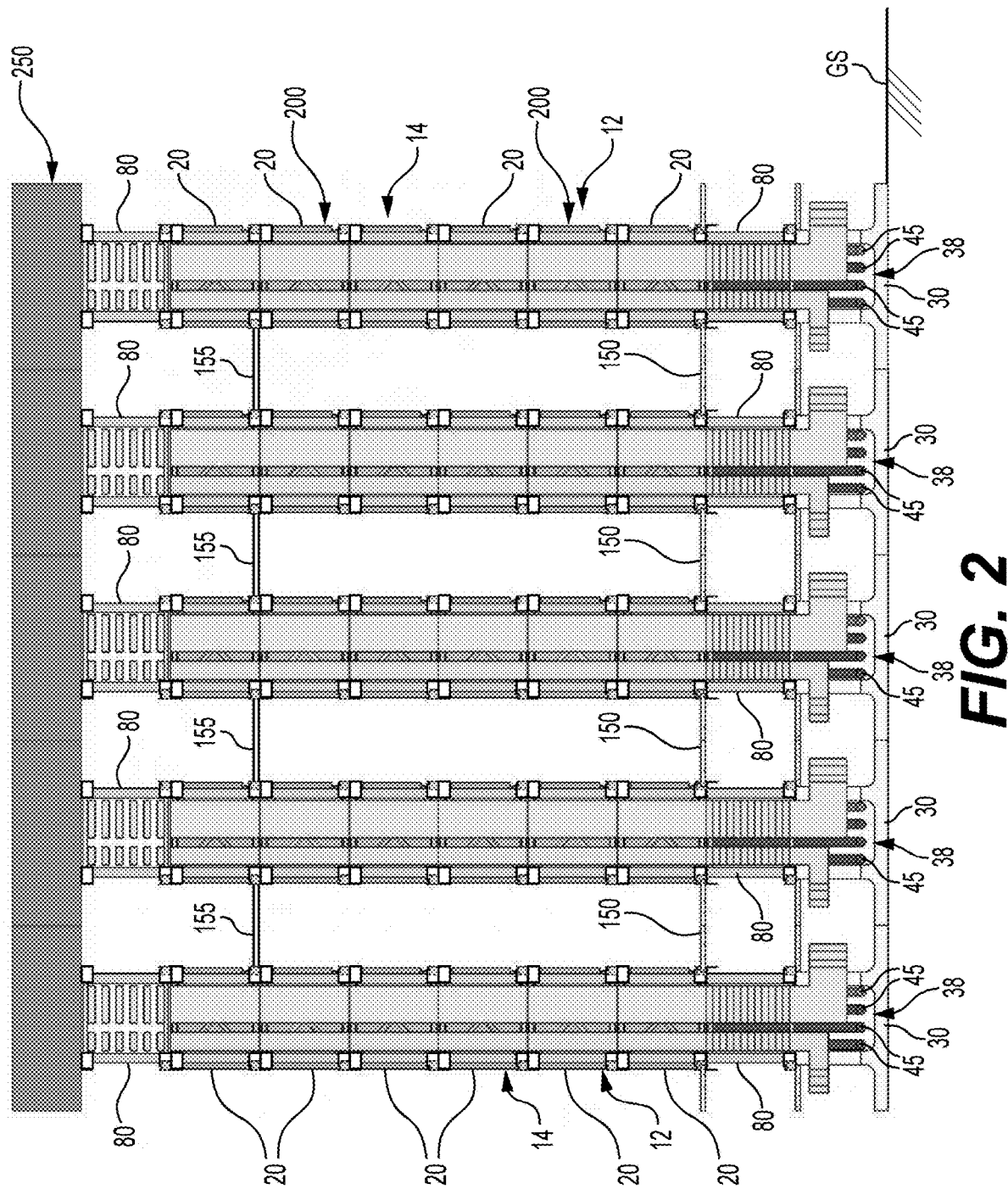
FIG. 2 is a right side elevation view of the rack system of FIG. 1.

FIGS. 1 and 2 illustrate a rack system 10 for use in a data center 100 in accordance with an embodiment of the present technology. The rack system 10 includes a plurality of racks 20 which are configured to house electronic equipment therein. In particular, the racks 20 are provided to house servers as well as networking equipment, power supply equipment and/or other supporting equipment for supporting the function of the servers (e.g., cooling equipment). The racks 20 may thus be referred to as "server racks". In this embodiment, the racks 20 are arranged in multiple rows 12 that are parallel to one another. As can be seen, multiple racks 20 are disposed above one another to form columns 14, with each row 12 including multiple laterally adjacent columns 14. For instance, in this particular embodiment, each column 14 includes six racks 20 stacked above one another. Disposing the racks 20 above one another in this manner allows the data center operator to more usefully exploit the vertical space available within the data center 100 to store more racks 20.

The racks 20 will now be described with reference to FIGS. 4 and 5. In this embodiment, each of the racks 20 is configured identically and therefore a single one of the racks 20 will be described herein. In this embodiment, the rack 20 has a rack frame 21 and defines three laterally adjacent housing sections 22. In use, each housing section 22 may receive a plurality of servers or other supporting equipment (e.g., networking equipment, power supply equipment, etc.). In other embodiments, the rack 20 may have a single housing 22. The rack 20 has a width measured between left and right ends 23, 24 of the rack 20 and a height measured between upper and lower ends of the rack 20. In this embodiment, the width of the rack 20 is greater than the height of the rack 20 and thus the rack 20 can be said to be horizontally-extending rather than vertically-extending. The width of the rack 20 may be less than the height of the rack 20 in other embodiments.

The electronic equipment (e.g., servers) stored within the housing sections 22 is accessible via a front side 25 of the rack 20. In use, in order to promote cooling of the electronic equipment supported by the rack 20, air is made to flow through the rack 20 from the front side 25 to a rear side 26 of the rack 20 such that hot air is expelled from the rear side 26 of the rack 20 as heat is transferred from the electronic equipment to the air flowing through the rack 20. For instance, fans may be provided in the rack 20 to promote the flow of air therethrough. Moreover, the rack 20 may be optionally provided with air-to-liquid heat exchangers disposed on the rear side 26 of the rack 20 in order to cool air flow discharged through the rear side 26 of the rack 20.

The racks 20 of each row 12 are oriented to form cold aisles and hot aisles between the rows 12. In particular, the front sides 25 of the racks 20 of two consecutive rows 12 face one another to form a cold aisle therebetween (where cool air is generally flowing into the racks 20) whereas the rear sides 26 of the racks 20 of two consecutive rows 12 face one another to form a hot aisle therebetween (where heated air is discharged by the racks 20).

As can be seen, in this embodiment, each rack 20 is connected to a stackable chassis 80, forming a rack assembly 200 therewith, to facilitate stacking and/or handling of the racks 20. In particular, the stackable chassis 80 provides a structure that is relatively compact and having support points that facilitate stacking of multiple stackable chassis 80 (with or without the rack 20 as will be discussed in more detail below). Moreover, as will be explained below, the stackable chassis 80 is connectable to other similar stackable chassis disposed thereabove or therebelow (i.e., within the same rack column 14) and/or laterally-adjacent thereto (i.e., within the same row 12 but in a laterally-adjacent column 14). As will be understood, in general, stacking the racks 20 rather than placing them within an oversized frame that supports each rack 20 individually can facilitate management of the data center 100 since each rack row 12 can be built gradually, thus providing a more adaptable approach to setting up the data center 100.

The stackable chassis 80 and the manner in which it is positioned relative to the corresponding rack 20 will now be described in detail.

Figure 4:
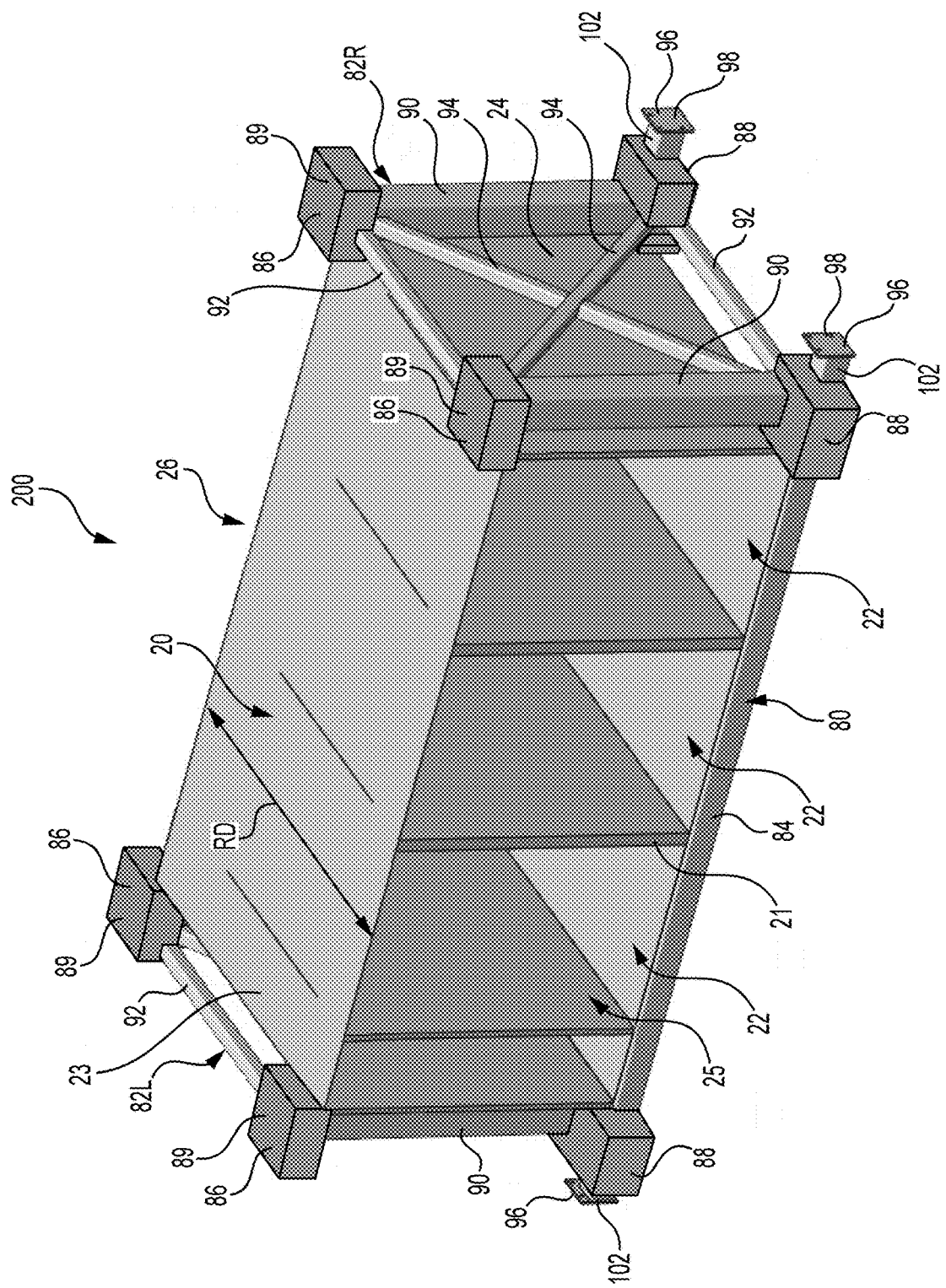
FIG. 4 is a perspective view, taken from a top, front, right side, of a rack assembly of the rack system of FIG. 1, including a stackable chassis and a rack connected thereto.
Figure 5:
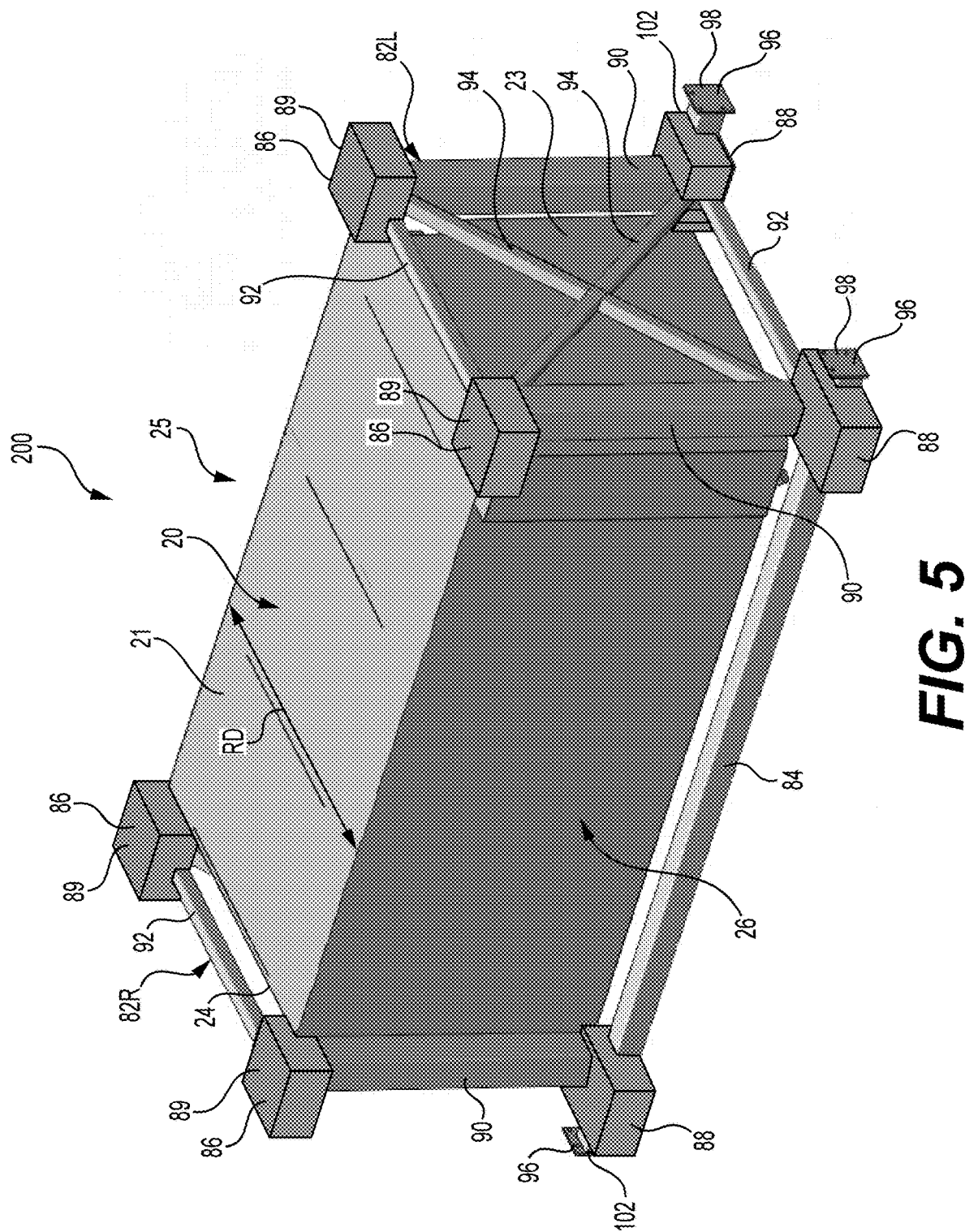
FIG. 5 is a perspective view, taken from a top, rear, right side, of the rack assembly of FIG. 4.

As shown in FIGS. 4 and 5, the stackable chassis 80 has a left side chassis portion 82L and a right side chassis portion 82R which, in this embodiment, are mirror images of one another. The left side chassis portion 82L defines a left end of the stackable chassis 80. The right side chassis portion 82R defines a right end of the stackable chassis 80. As can be seen, the rack 20 is received between the left and right side chassis portions 82L, 82R such that the left and right side chassis portions 82L, 82R flank the rack 20 on either side, namely with the left side chassis portion 82L being disposed leftward of the left end of the rack 20 and the right side chassis portion 82R being disposed rightward of the right end of the rack 20.

The left side and right side chassis portions 82L, 82R are interconnected by two elongated lower chassis members 84 which extend laterally. In this embodiment, the lower chassis members 84 include a front lower chassis member 84 and a rear lower chassis member 84 which are spaced apart in the front-to-rear direction and are vertically aligned with one another. In use, the lower chassis members 84 are disposed below a bottom surface of the rack 20 of the rack assembly 200 to support the rack 20 thereabove. That is, the bottom surface of the rack 20 is at least partly disposed on an upper surface of each of the lower chassis members 84.

The rack 20 could be connected to the supporting chassis 80 in any suitable way. For instance, in this embodiment, the rack 20 is fastened to the supporting chassis 80 by mechanical fasteners (e.g., bolts). In other embodiments, the rack 20 could be alternatively or additionally strapped to the supporting chassis 80. Furthermore, it is contemplated that, in some embodiments, the supporting chassis 80 may comprise the structures which support the servers or other electronic equipment such that the supporting chassis 80 itself functions as the rack 20. As such, the supporting chassis 80 may itself be considered as being part of a rack in some embodiments.

In this embodiment, the stackable chassis 80 has a generally U-shaped profile, notably when looking at the stackable chassis 80 from the front or the rear thereof. In particular, in this embodiment, the stackable chassis 80 does not include upper lateral members (parallel to the lower chassis members 84) interconnecting the left and right side chassis portions 82L, 82R. Notably, this allows the rack 20 to be easily lowered onto the lower chassis members 84 (e.g., via a forklift) without any members of the stackable chassis 80 interfering or having to be removed. This can facilitate the process of assembling the rack assembly 200. The stackable chassis 80 may be shaped differently in other embodiments.

As will be described below, the left and right side chassis portions 82L, 82R provide the stackable chassis 80 with support points for conveniently stacking multiple ones of the stackable chassis 80 above one another. With continued reference to FIGS. 4 and 5, in this embodiment, each of the left side and right side chassis portions 82L, 82R has front and rear upright members 90 extending parallel to one another. Upper and lower longitudinal members 92 extend between opposite ends of the upright members 90, perpendicularly thereto. In this embodiment, for each of the left and right side chassis portions 82L, 82R, two diagonal members 94 extend between the front and rear upright members 90. Each diagonal member 94 extends from the lower end portion of one of the upright members 90 to the upper end portion of the opposite upright member 90. In this embodiment, the members 90, 92, 94 are all elongated members.

Figure 8:
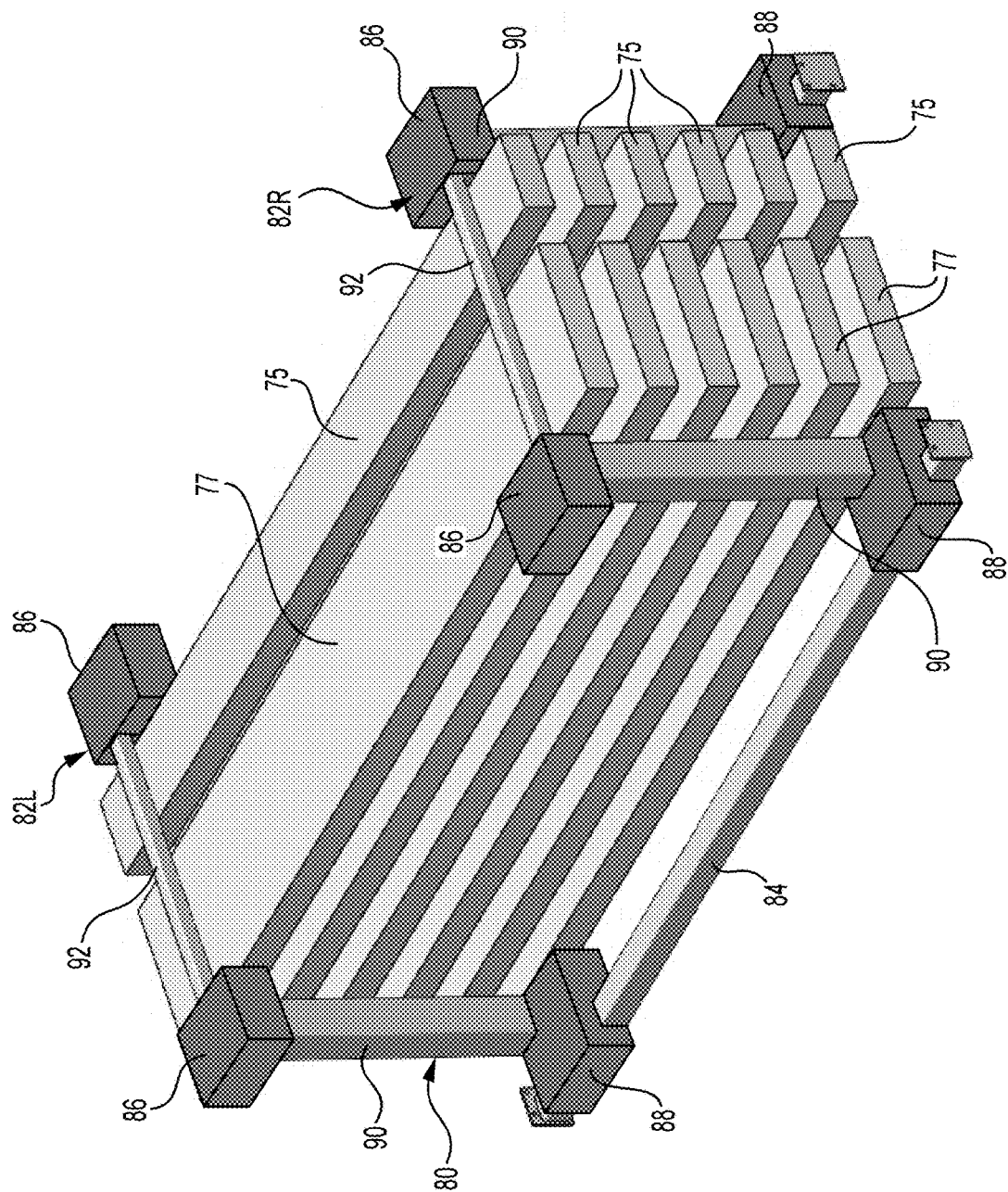
FIG. 8 is a perspective view, taken from a top, front, right side, of a stackable chassis partly surrounding wiring.

The left side and right side chassis portions 82L, 82R may be configured differently in other embodiments. For instance, the diagonal members 94 may be omitted in some embodiments (for example as shown in FIG. 8 which will be described in more detail further below) and/or replaced by other members parallel to the longitudinal members 92.

Each of the left side and right side chassis portions 82L, 82R also has front and rear upper supports 86 and front and rear lower supports 88. The front and rear upper supports 86 of each of the left side and right side chassis portions 82L, 82R are spaced apart from one another in the front-to-rear direction of the rack 20. Similarly, the front and rear lower supports 88 of each of the left side and right side chassis portions 82L, 82R are spaced apart from one another in the front-to-rear direction of the rack 20. As the supports 86, 88 are generally located at upper and lower corners respectively of the supporting chassis 80, they may be referred to as "corner supports". The lower corner supports 88 are disposed vertically lower than the upper corner supports 86. The corner supports 86, 88 of the stackable chassis 80 provide four support points on an upper side of the stackable chassis 80 and four supports points on a lower side of the stackable chassis 80 for stacking multiple ones of the stackable chassis 80. In this embodiment, the upper corner supports 86 are arranged to form the vertices of a rectangle described therebetween. Similarly, the lower corner supports 88 are arranged to form the vertices of a rectangle described therebetween.

In this embodiment, the upper corner supports 86 are connected between the upright members 90 and the upper longitudinal members 92, while the lower corner supports 88 are connected between the upright members 90 and the lower longitudinal members 92. Notably, in this embodiment, the upper corner supports 86 are connected to respective upper ends of the upright members 90. For example, the upper corner supports 86 may be welded to the upper ends of the upright members 90 or otherwise fastened thereto. Moreover, in this embodiment, the lower corner supports 88 are connected to respective lower ends of the upright members 90. For example, the lower corner supports 88 may be welded to the lower ends of the upright members 90 or otherwise fastened thereto. In addition, in this embodiment, the lower corner supports 88 are fastened to respective ones of the front and rear lower chassis members 84.

Figure 3:
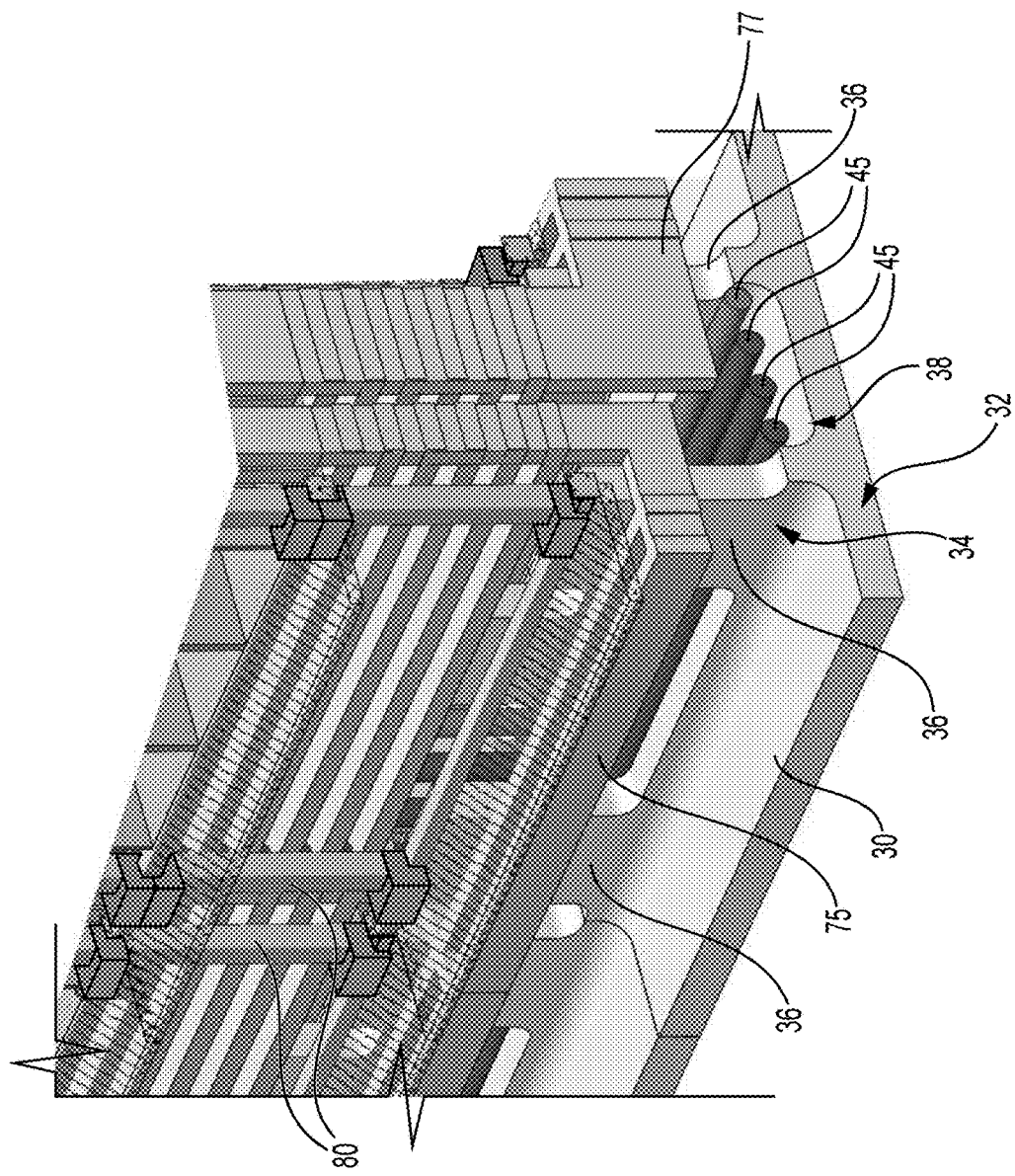
FIG. 3 is a perspective view of part of a rack column of the rack system of FIG. 1, including a supporting pedestal thereof.

As shown in FIGS. 2 and 3, the upper corner supports 86 are configured to support the lower corner supports 88 of another stackable chassis 80 (e.g., of another rack assembly 200 to be stacked thereabove). The lower corner supports 88 are configured to be supported by the upper corner supports 86 of another stackable chassis (e.g., of another rack assembly 200 to be stacked therebelow) or of any other support surface.

In this embodiment, each of the corner supports 86, 88 has a generally rectangular prism shape. Each of the upper corner supports 86 has an upper support surface 89 facing upwardly. Each of the lower corner supports 88 has a lower support surface (not shown) facing downwardly. As shown in FIGS. 2 and 3, in this embodiment, the upper support surface 89 is configured to support thereon the lower support surface of the lower corner supports 88 of another stackable chassis 80 stacked thereon. Similarly, in this embodiment, the lower support surface of the lower corner supports 88 is configured to be supported on the upper support surface 89 of a corresponding upper corner support 86 of another stackable chassis 80 disposed therebelow, or another supporting structure as will be described in more detail below. The upper and lower corner supports 86, 88 are configured to be fastened by one or more mechanical fasteners to corresponding lower and upper corner supports of another stackable chassis 80.

Figure 6B:
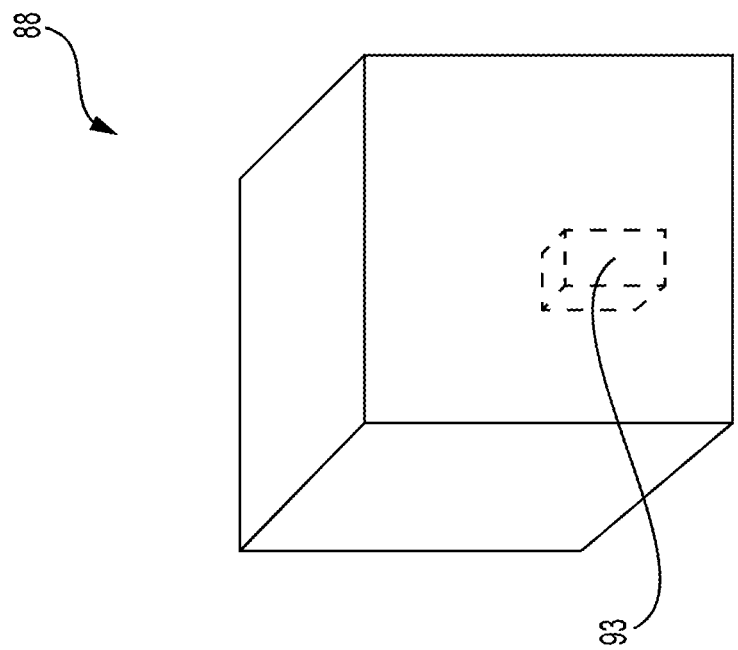
FIG. 6B is a perspective view of a lower support of the stackable chassis of FIG. 4.
Figure 6A:
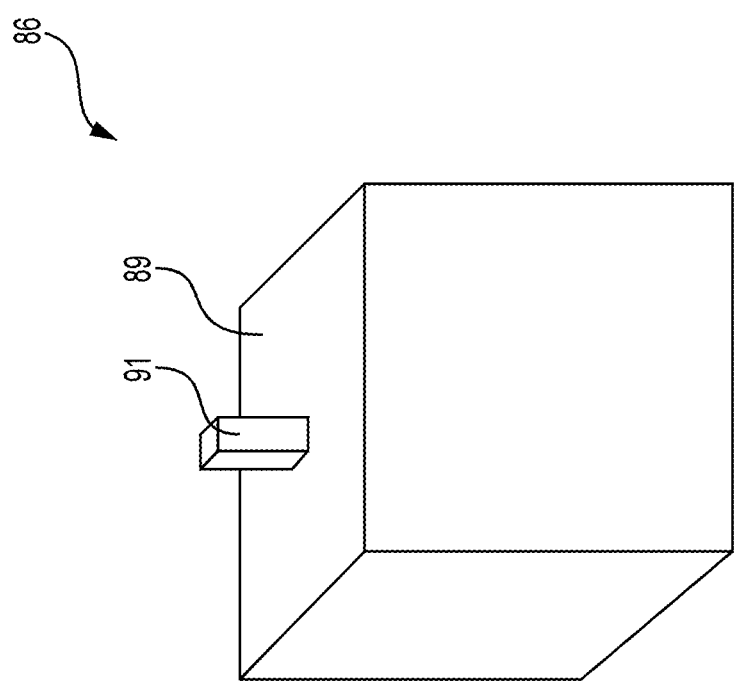
FIG. 6A is a perspective view of an upper support of the stackable chassis of FIG. 4.

With reference to FIGS. 6A and 6B, in some embodiments, each of the upper corner supports 86 could have one or more locating features 91 for guiding the stacking of another (upper) stackable chassis atop the stackable chassis 80. In this example, the locating feature 91 is a projection 91 extending upwardly from the upper support surface 89. Moreover, as shown in FIG. 6B, in this embodiment, each of the lower corner supports 88 has one or more corresponding locating features 93 configured to engage the locating feature 91 of another (lower) stackable chassis 80. More specifically, in this example, the locating feature 93 is a recess 93 defined by the lower support surface of the lower corner support 88 and configured to receive therein a corresponding projection 91 of a stackable chassis 80 disposed therebelow. In this embodiment, the projection 91 and the recess 93 are illustrated as being generally rectangular and prismatic, however it is contemplated that they could have any other suitable shape in other embodiments. Moreover, it is contemplated that, in other embodiments, the lower corner supports 88 could have the projections 91 while the upper corner supports 86 define the recesses 93.

The corner supports 86, 88 could be configured differently in other embodiments. For instance, it is contemplated that, in some embodiments, the corner supports 86, 88 could be L-shaped brackets.

Figure 15:
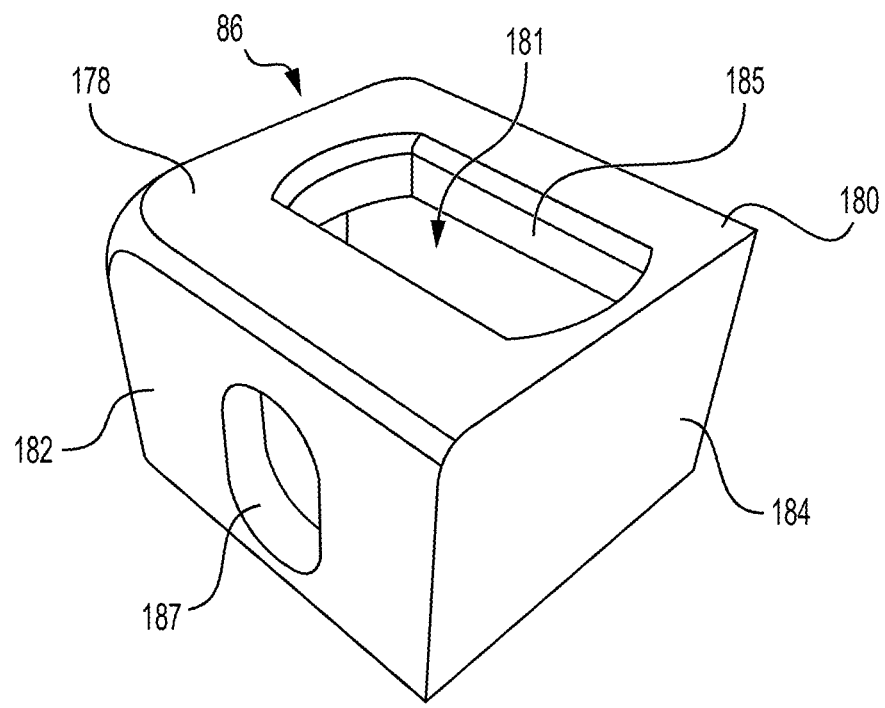
FIG. 15 is a perspective view of the upper corner support of the stackable chassis according to another embodiment.
Figure 17:
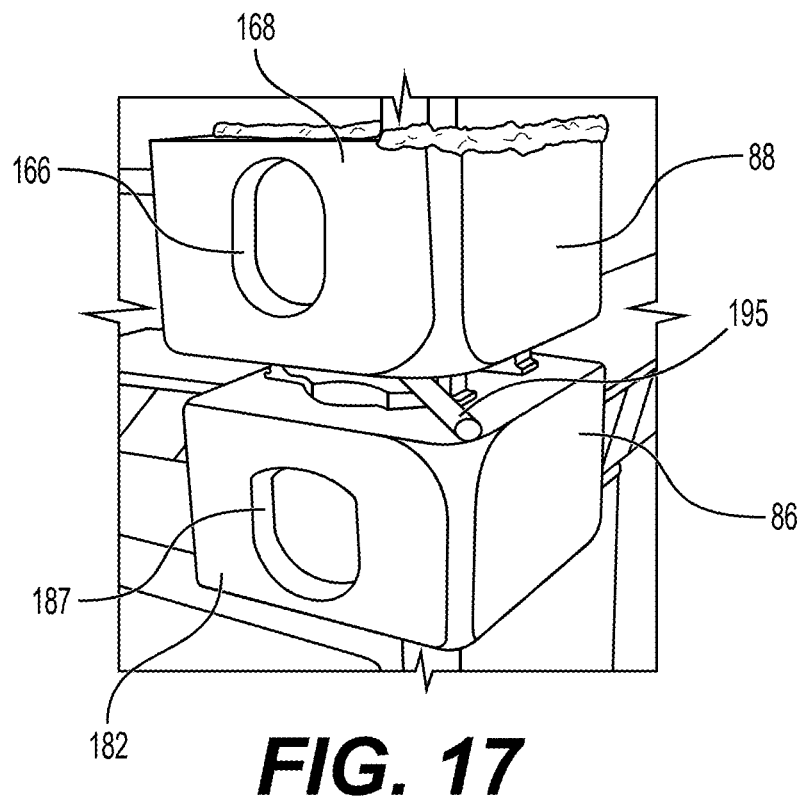
FIG. 17 is a perspective view of an upper corner support and a lower corner support of the stackable chassis.

With reference to FIG. 15, another embodiment of the corner supports 86, 88 will be described herein in which the corner supports 86, 88 are secured to one another differently. Notably, FIG. 15 illustrates a front upper corner support 86 having a body 178 which has a generally rectangular prismatic shape. The body 178 has an upper face 180, a lower face (not shown), a front face 182, two lateral faces 184 (one of which is shown in FIG. 15), and a rear face (not shown). As can be seen, the upper face 180 defines an upper opening 185 while the front face 182 defines a front opening 187. The body 178 is hollow between the walls defining the different outer faces thereof. The front upper corner support 86 shown in FIG. 15 is configured to support and be secured to a corresponding front lower corner support 88 (illustrated in FIG. 17) of an upper stackable chassis 80. As shown in FIG. 17, the front lower corner support 88 has a similar configuration to the front upper corner support 86 of FIG. 15 however, rather than having the upper opening 185, the front lower corner support 88 has a front opening 166 on a front face 168 thereof and a lower opening (not shown) on the lower face thereof facing the front upper corner support 86 to which it is connected.

Figure 16:
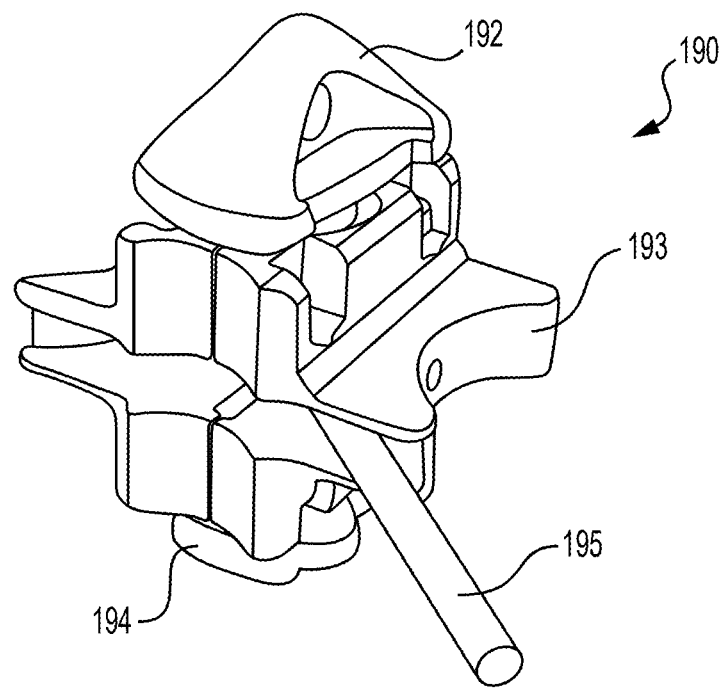
FIG. 16 is a perspective view of a connecting device for connecting the corner supports of the stackable chassis.

A locking device 190, shown in FIG. 16, is configured to be used in conjunction with the two matching corner supports 86, 88 of FIG. 17 in order to secure them to one another. The locking device 190 has a base 193 and upper and lower rotatable locking members 192, 194 rotatably connected to the base 193 about a common axis (not shown). The locking members 192, 194 are disposed on opposite sides of the base 193. A lever 195 is connected to the rotatable locking members 192, 194 to rotate the locking members 192, 194 between locked and unlocked positions.

Notably, in this embodiment, the lever 195 can be handled by a user to rotate the locking members 192, 194 by 900 between the locked and unlocked positions. The locking members 192, 194 are insertable, respectively, through the lower opening of the front lower corner support 88 and through the upper opening 185 of the front upper corner support 86. The locking members 192, 194 are then rotated to their locked positions via the lever 195. In their locked positions, the locking members 192, 194 are not removable through the respective openings of the corner supports 86, 88 and thereby secure the corner supports 86, 88 to one another. Although this locking system is shown with reference to one of the front upper corner supports 86 and one of the front lower corner supports 88 of two stackable chassis 80 stacked one atop another, it is to be understood that a similar arrangement is provided between the other corresponding corner supports 86, 88 between the two stackable chassis 80. Therefore, the configuration of the other corner supports 86, 88 will not be described in detail herein. Such locking systems are used for connecting shipping containers and commonly referred to as "twist lock" systems.

Figure 18:
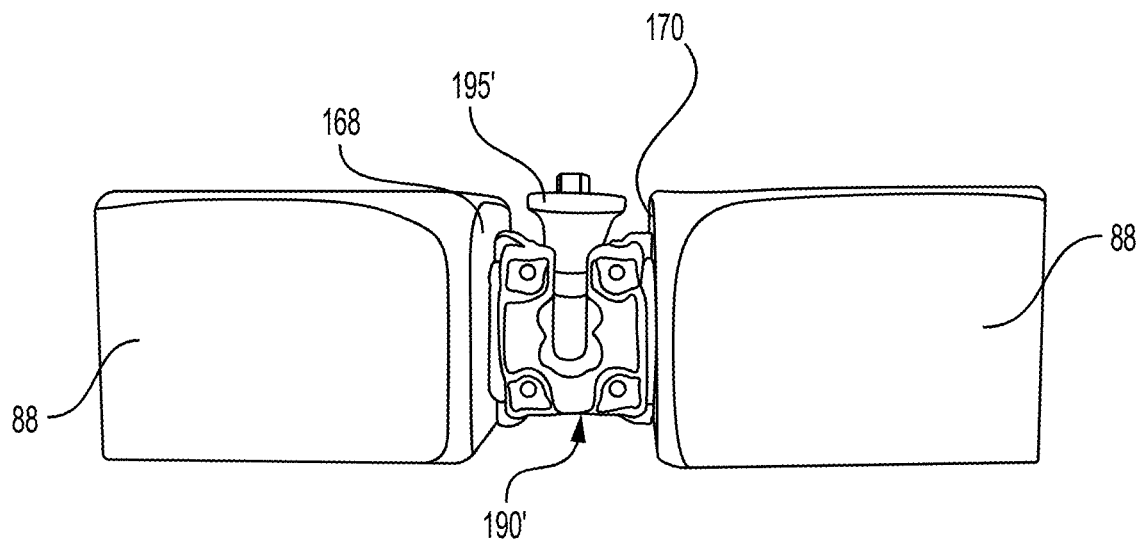
FIG. 18 is a side elevation view of two of the lower corner supports of the stackable chassis.

As shown in FIG. 18, the corner supports of FIGS. 15 and 17 can also be connected to one another in the front-to-rear direction in addition to the vertical direction. Notably, as shown in FIG. 18, a locking device 190' similar to the locking device 190 described above secures two lower corner supports 88 of two stackable chassis 80 to one another. In particular, a rear locking member (not shown) of the locking device 190' is inserted into the front opening 166 (FIG. 17) of a front lower corner support 88 of one stackable chassis 80 while the front locking member (not shown) of the locking device 190' is inserted into a rear opening (not shown) on a rear face 170 of the rear lower corner support 88 of another stackable chassis 80. A lever 195' of the locking device 190' is then moved to rotate the front and rear locking members to their locked positions, thereby securing the front lower corner support 88 to the rear lower corner support 88. While not shown herein, the corner supports 86, 88 can be connected in the same manner to corresponding corner supports 86, 88 of another stackable chassis 80.

It is contemplated that the corner supports 86, 88 could be configured differently in other embodiments. For example, the corner supports 86, 88 could be angular brackets such that two mated corner supports 86, 88 of two different stackable chassis 80 could be connected to one another vertically and/or in the front-to-rear direction.

Figure 9:
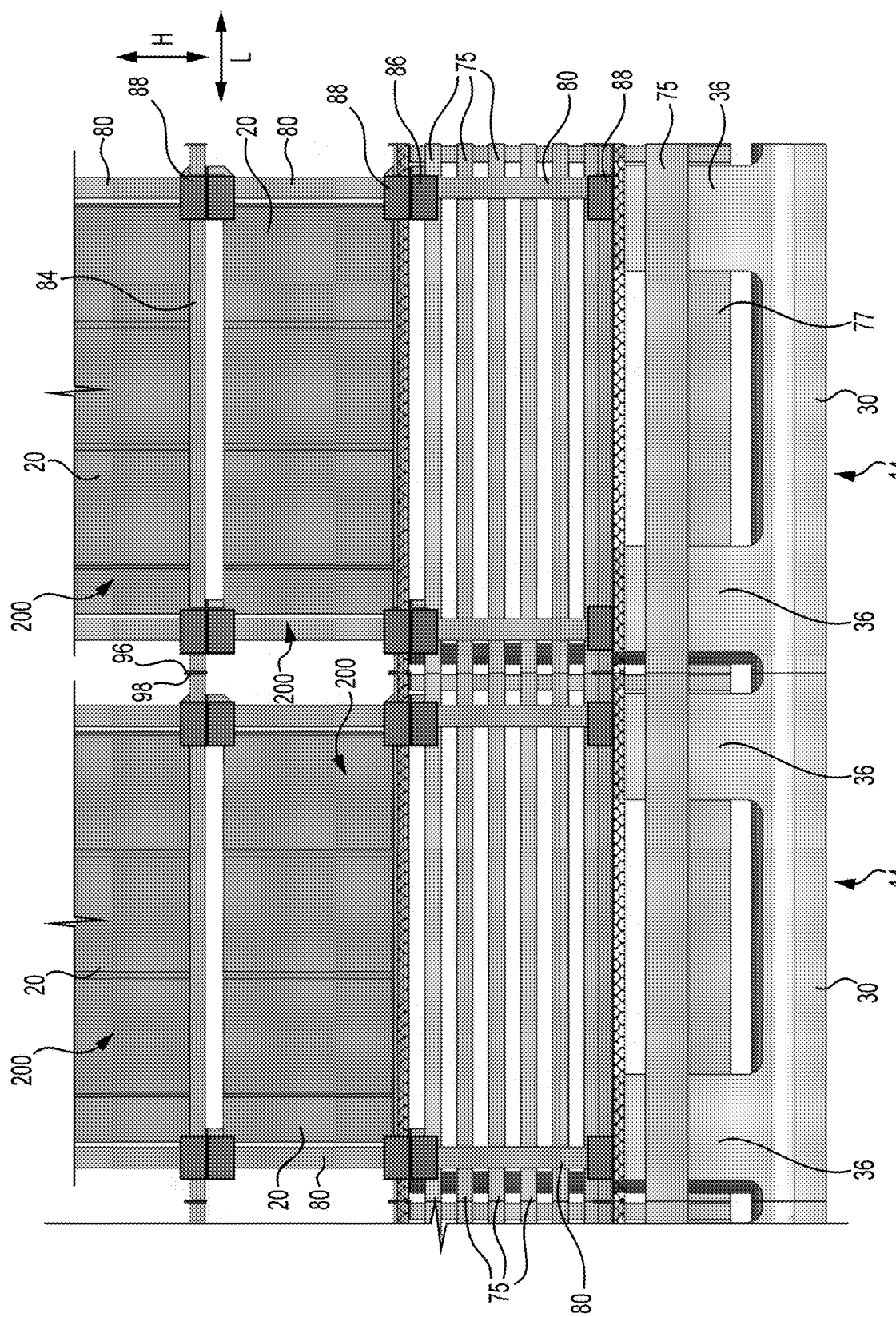
FIG. 9 is a front elevation view of part of a row of the rack system of FIG. 1.

Returning now to FIGS. 4 and 5, in this embodiment, each of the left and right side chassis portions 82L, 82R also has front and rear lateral connecting flanges 96 configured to be connected to a laterally adjacent server rack assembly 200. More specifically, as shown in FIG. 9, the left side chassis portion 82L has front and rear lateral connecting flanges 96 which are configured to be connected to a leftwardly adjacent server rack assembly 200, namely to the corresponding lateral connecting flanges 96 of its stackable chassis 80, forming part of a leftwardly adjacent rack column 14. Similarly, the right side chassis portion 82L has front and rear lateral connecting flanges 96 which are configured to be connected to a rightwardly adjacent server rack assembly 200, namely to the corresponding lateral connecting flanges 96 of its stackable chassis 80, forming part of a rightwardly adjacent rack column 14. Notably, each lateral connecting flange 96 has a vertical surface 98 facing laterally outwardly and configured to be mated to the corresponding vertical surface 98 of another stackable chassis 80. Returning to FIGS. 4 and 5, in this embodiment, the lateral connecting flanges 96 are generally vertically aligned with the lower corner supports 88. In other words, the lateral connecting flanges 96 are disposed vertically lower than the upper corner supports 86. Moreover, each lateral connecting flange 96 is connected to an end of a lateral end member 102 extending laterally from a corresponding lower corner support 88.

As will be appreciated, together, the upper and lower corner supports 86, 88 and the lateral connecting flanges 96 allow the stackable chassis 80 to be connected in multiple directions to other stackable chassis 80. Namely, with reference to FIG. 9, the stackable chassis 80 is connectable in a height direction H (i.e., vertically) and in the front-to-rear direction via the upper and lower corner supports 86, 88, as well as in a lateral direction L via the lateral connecting flanges 96.

Figure 7:
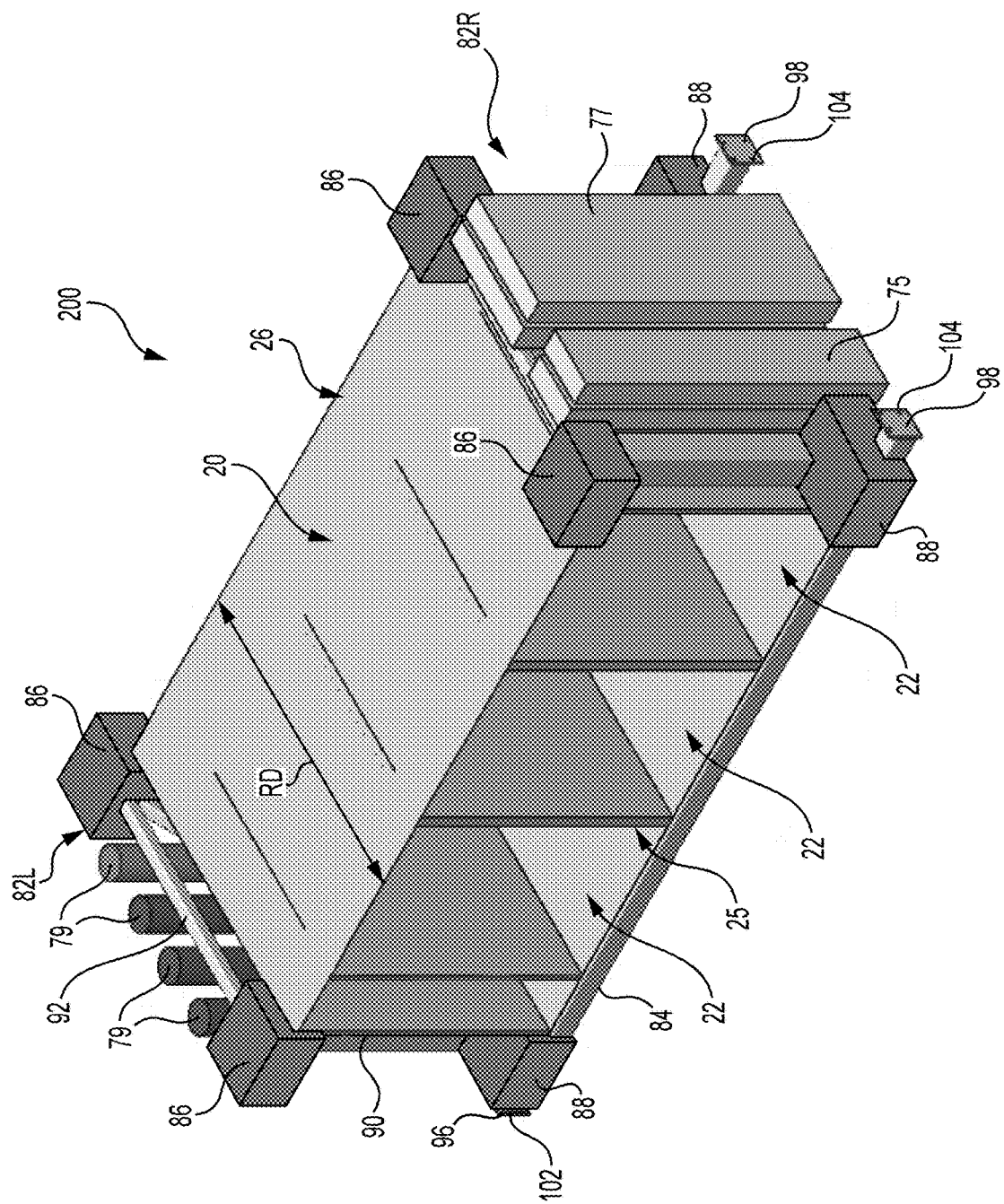
FIG. 7 is a perspective view, taken from a top, front, right side, of the rack assembly of FIG. 4, shown with vertical conduits and wiring extending along the sides of the stackable chassis.

With reference to FIG. 7, in this embodiment, the stackable chassis 80 is configured to facilitate the passage of wiring and/or conduits through the rack rows 12 constituted by the rack assemblies 200. To that end, the lateral connecting flanges 96 are disposed laterally outward of the part of corresponding ones of the left side and right side chassis portions 82L, 82R extending between the front and rear upper corner supports 86 thereof. More specifically, for the left side chassis portion 82L, the lateral connecting flanges 96 are disposed leftward of the longitudinal members 92 of the left side chassis portion 82L. Similarly, for the right side chassis portion 82R, the lateral connecting flanges 96 are disposed rightward of the longitudinal members 92 of the right side chassis portion 82R. As such, in this embodiment, an open space is defined on each of the left and right side of the stackable chassis 80 bound longitudinally between the front and rear lateral end members 102 and laterally between the lateral connecting flanges 96 and the longitudinal members 92. Notably, as shown in FIG. 7, this space can accommodate a multitude of conduits 79 and/or wiring 75, 77 (shown schematically as bundles of wiring in FIG. 7) extending vertically therein. For example, the wiring 75, 77 may be electrical or network wiring. The conduits 79 may be provided to conduct cooling liquid (e.g., water) to cooling equipment disposed on the racks 20. As such, the stackable chassis 80 can accommodate the conduits and/or wiring on the sides of the stackable chassis 80, including between two laterally-adjacent stackable chassis 80. This can facilitate routing such conduits or wiring to the upper rack assemblies 200 of the rack columns 14.

Furthermore, the stackable chassis 80 is dimensioned to be relatively compact. For instance, in this embodiment, the stackable chassis 80 is dimensioned to fit within a standard shipping container so as to be easily transportable and not occupy significant space within the rows 12 relative to the racks 20. In particular, in this embodiment, the width of the stackable chassis 80 measured between the laterally opposite lateral connecting flanges 96 is between 1 m and 3 m inclusively, and the depth of the stackable chassis 80 (i.e., the dimension thereof in the front-to-rear direction) is between 1 m and 1.5 m inclusively. More specifically, in this embodiment, the width of the stackable chassis 80 is approximately 2.5 m (i.e., +/−10%) and the depth of the stackable chassis 80 is approximately 1.1 m (i.e., +/−10%). Meanwhile, a height of the stackable chassis 80, measured between the upper and lower corner supports 86, 88 is between 0.8 m and 1.2 m inclusively. In particular, in this embodiment, the height of the stackable chassis 80 is approximately 1 m (i.e., +/−10%).

In addition to being used together with the rack 20 to facilitate its handling, the stackable chassis 80 may also be used without the rack 20 and provide a stackable structure which can be used for example for routing conduits and/or the wiring 75, 77 therethrough as shown in FIG. 8. Notably, as shown in FIGS. 8 and 9, in some embodiments, the diagonal members 94 of the left and right side chassis portions 82L, 82R are omitted so that the wiring 75, 77 (or conduits) may extend laterally through the left and right ends of the stackable chassis 80, vertically between the longitudinal members 92. For instance, as shown in FIG. 9, the stackable chassis 80 may be disposed below a plurality of rack assemblies 200 of a given column 14. As such, for a given row 12, a layer of stackable chassis 80 vertically aligned with one another may be provided to route conduits and/or wiring 75, 77 consecutively therethrough.

Returning now to FIGS. 1 and 2, in this embodiment, the rack system 10 includes a plurality of supporting pedestals 30 for supporting respective ones of the rack columns 14. In particular, the supporting pedestals 30 are configured to be positioned on a ground surface GS (FIG. 2) of the data center 100 to distribute the load of the rack columns 14 on the ground surface GS. Notably, the collective load of the racks 20 of each rack column 14 can be significant, particularly when more than two racks 20 are to be stacked atop one another. The supporting pedestals 30 can facilitate handling of these loads at the bottom of the rack columns 14.

Figure 10:
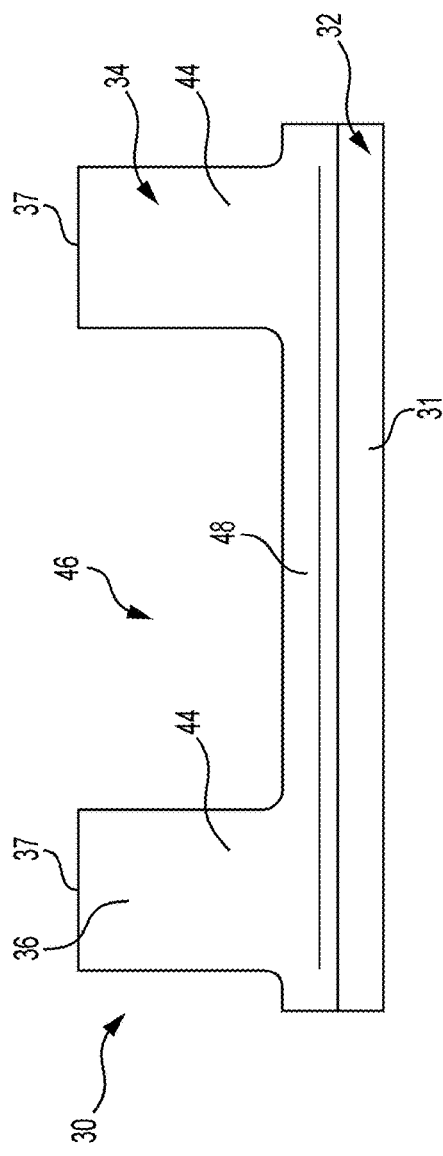
FIG. 10 is a front elevation view of the supporting pedestal.
Figure 11:
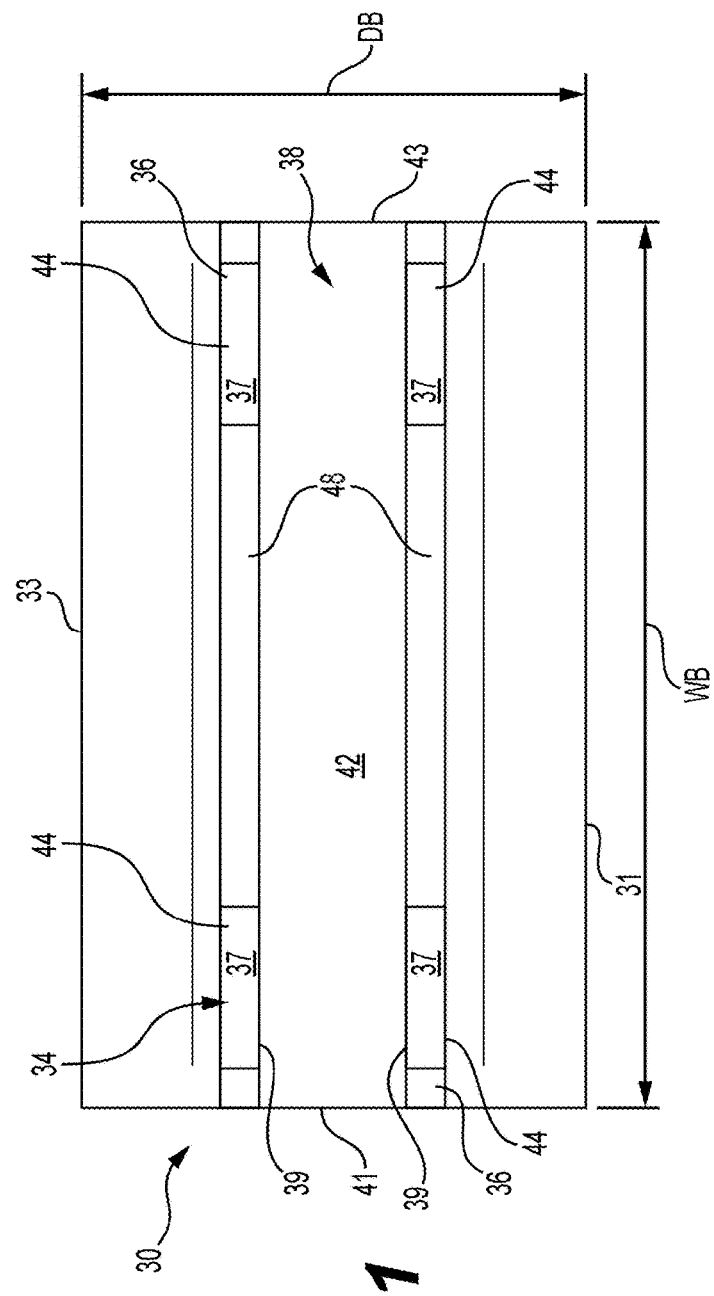
FIG. 11 is a top plan view of the supporting pedestal of FIG. 10.
Figure 12:
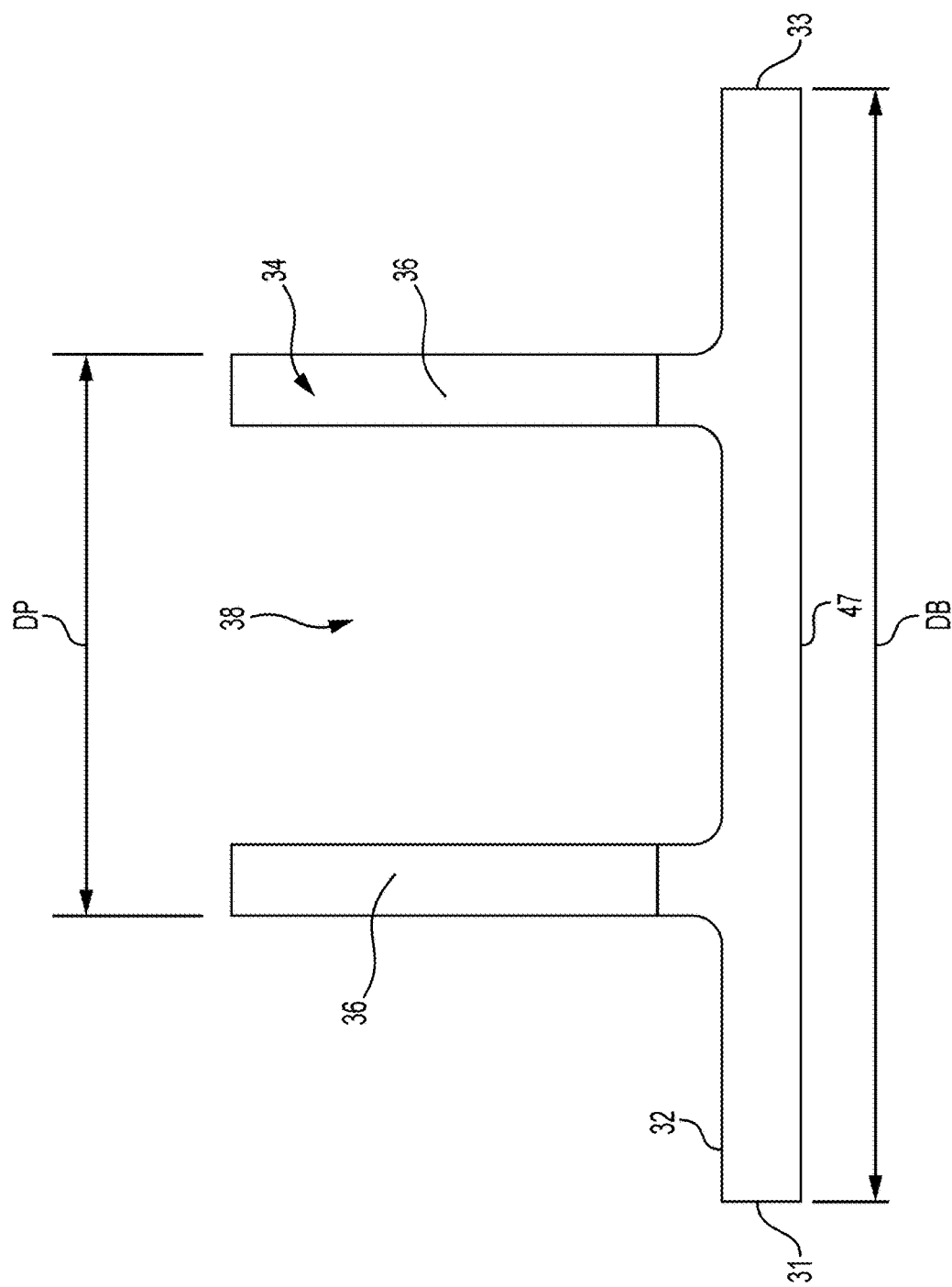
FIG. 12 is a right side elevation view of the supporting pedestal of FIG. 10.

An exemplary one of the supporting pedestals 30 will now be described with reference to FIGS. 10 to 12. The supporting pedestal 30 has a lower base portion 32 and an upper pillar portion 34 extending upwardly from the lower base portion 32. In this embodiment, the lower base portion 32 is generally planar and extends parallel to the ground surface GS of the data center 100. The lower base portion 32 has a bottom surface 47 which is placed in contact (i.e., mated) with the ground surface GS so that the lower base portion 32 is supported by the ground surface GS. As shown in FIGS. 11 and 12, the lower base portion 32 has a depth DB measured in the front-to-rear direction between front and rear ends 31, 33 of the lower base portion 32 and a width WB measured laterally (i.e., perpendicularly to the depth DB) between left and right ends 41, 43 of the lower base portion 32 which define the left and right ends 41, 43 of the supporting pedestal 30. The depth DB and the width WB correspond to the depth and the width of the supporting pedestal 30 and therefore may be referred to as a pedestal depth DB and a pedestal width WB respectively. The bottom surface 47 of the lower base portion 32 extends along the entirety of the depth DB and the width WB such that the area of the bottom surface 47 is the pedestal depth DB multiplied by the pedestal width WB. In some embodiments, the bottom surface 47 may extend along a portion of the pedestal depth DB and/or the pedestal width WB (i.e., along a majority thereof). In this embodiment, the pedestal width WB is approximately the same as the width of the racks 20. However, as can be seen, the lower base portion 32 is dimensioned such that the pedestal depth DB is greater than the rack depth of the racks 20. As such, the supporting pedestals 30 distribute the load of the corresponding rack columns 14 over a greater area of the ground surface GS than is possible by a rack 20 if it were unsupported by the supporting pedestal 30. For instance, a ratio DB/RD of the pedestal depth DB over the rack depth RD of the racks 20 may be between 1.2 and 2.5 inclusively. In particular, in this embodiment, the ratio of the pedestal depth DB over the rack depth RD of the racks 20 is approximately 2.

Figure 13:
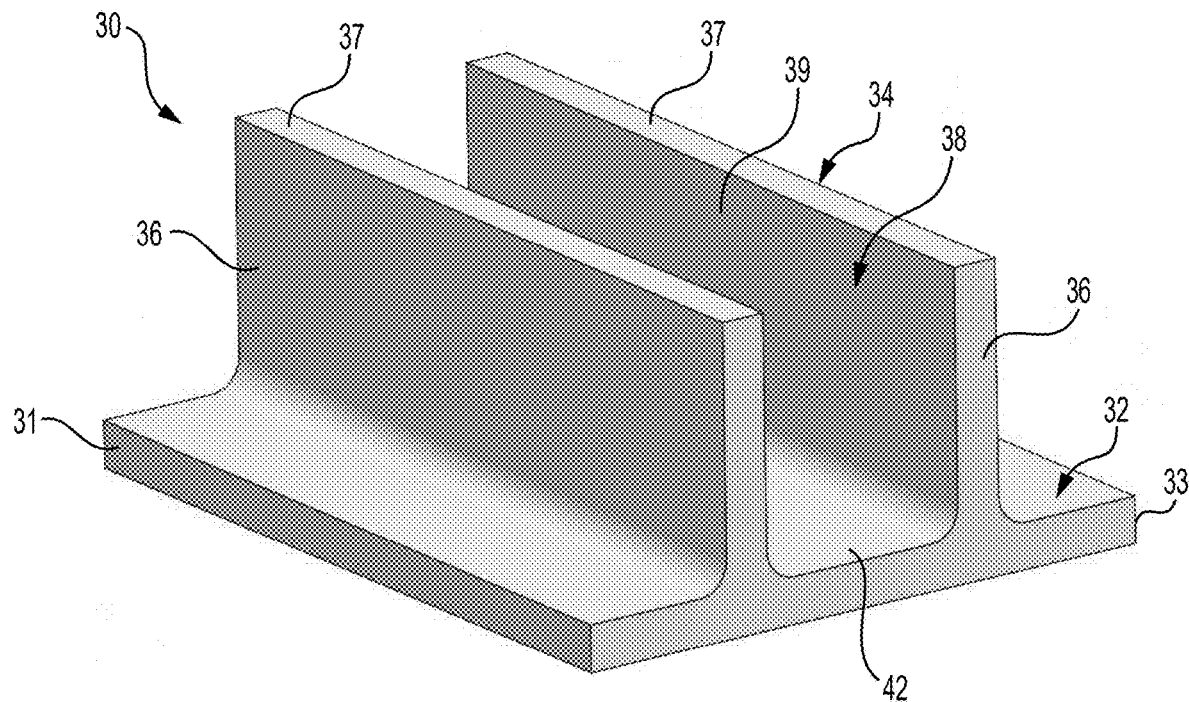
FIG. 13 is a perspective view, taken from a top, front, right side, of a supporting pedestal according to another embodiment.

The upper pillar portion 34 includes two parallel pillar walls 36, namely front and rear pillar walls 36, extending generally vertically from the lower base portion 32. Each pillar wall 36 extends laterally, particularly, in this embodiment, from the left end to the right end of the supporting pedestal 30. The pillar walls 36 may extend along a limited portion of the width of the supporting pedestal 30 in other embodiments. As shown in FIG. 10, in this embodiment, each pillar wall 36 has two raised sections 44 laterally spaced apart from one another and a lowered section 48 extending between the two raised sections 44, such that the pillar wall 36 defines a recess 46 between the two raised sections 44. Each raised section 44 defines an upper surface 37 of the corresponding pillar wall 36 which, in use, supports a corresponding stackable chassis 80 of an upper rack assembly 200. While providing the raised and lowered sections 44, 48 reduces the weight of the supporting pedestal 30, in other embodiments, the pillar walls 36 may be configured to have a constant height, such as in an alternative embodiment illustrated in FIG. 13.

As shown in FIG. 12, the upper pillar portion 34 has a pillar depth DP measured in the front-to-rear direction. In this embodiment, the pillar depth DP is measured between outer surfaces of the two pillar walls 36. The pillar depth DP is less than the pedestal depth DB. More particular, the pillar depth DP is approximately equal to (i.e., within 10% of) of a distance between the front and rear lower corner supports 88 of the stackable chassis 80. As such, as shown in FIGS. 2 and 9, the lower corner supports 88 of the stackable chassis 80 can be supported by the pillar walls 36, and the upper pillar portion 34 is kept relatively compact.

The front and rear pillar walls 36 are spaced apart from one another in the front-to-rear direction to define a pedestal channel 38 therebetween. Notably, the pedestal channel 38 is defined by respective inner surfaces 39 (FIG. 11) of the pillar walls 36 and an upper surface 42 of the lower base portion 32. The pedestal channel 38 is generally rectilinear and extends laterally between the left end and the right end of the upper pillar portion 34. Moreover, in this embodiment, the pedestal channel 38 is open from a top thereof. That is, the pedestal channel 38 is not enclosed from the top. The pedestal channel 38 may be closed from the top thereof in other embodiments.

As shown in FIGS. 2 and 3, the pedestal channel 38 extends below the racks 20 of the corresponding rack column 14. In particular, the pedestal channel 38 is configured to receive conduits 45 which service equipment housed by the racks 20. Notably, laterally adjacent ones of the supporting pedestals 30 (i.e., the supporting pedestals 30 of the same row 12) are positioned such that their respective pedestal channels 38 are aligned with one another. As such, the conduits 45, which are generally rectilinear, extend within the pedestal channels 38 of the supporting pedestals 30 of the same row 12. In this embodiment, the conduits 45 are liquid cooling conduits that conduct cooling liquid such as water to/from cooling devices (e.g., water blocks and/or air-to-liquid heat exchangers) disposed within at least some of the racks 20. For instance, the conduits 45 are fluidly connected to the vertically extending conduits 79 (FIG. 7) that route the cooling liquid toward the racks 20 disposed above the supporting pedestals 30. Other types of conduits 45 are contemplated in other embodiments. For instance, in other embodiments, the conduits 45 could include an electrical conduit to power electronic equipment stored in the racks 20. The conduits 45 are also fluidly connected to an external cooling circuit which includes other cooling equipment (e.g., a dry cooler) in order to cool the cooling liquid which is then recirculated back to the racks 20 via the conduits 45.

Figure 14:
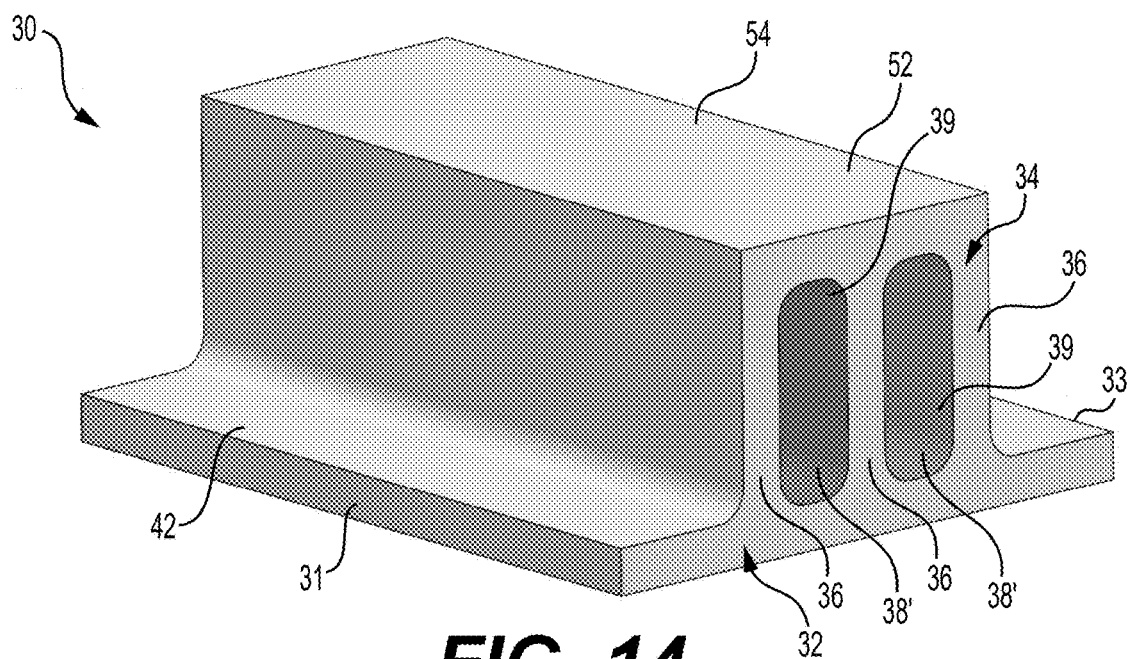
FIG. 14 is a perspective view, taken from a top, front, right side, of a supporting pedestal according to another embodiment.

The upper pillar portion 34 may be configured differently in other embodiments. For instance, as shown in FIG. 14, in an alternative embodiment, the upper pillar portion 34 has three pillar walls 36 extending generally vertically from the lower base portion 32, and an upper wall 52 interconnecting the upper ends of the three pillar walls 36. Notably, the upper wall 52 defines an upper surface 54 of the upper pillar portion 34. As can be seen, in this alternative embodiment, the upper pillar portion 34 defines two pedestal channels 38', namely a front pedestal channel 38' and a rear pedestal channel 38', which extend generally parallel to one another. In particular, the front and rear pedestal channels 38' extend generally laterally from the left end to the right end of the upper pillar portion 34. In this alternative embodiment, the front and rear pedestal channels 38'are configured to allow fluid flow therein such that, when fluid flows in the pedestal channels 38', the fluid is in contact with inner surfaces 39 of the pillar walls 36. A coating may define the inner surfaces 39 in some embodiments (e.g., a waterproof resin). As will be understood, in this alternative embodiment, the conduits 45 can be omitted as the pedestal channels 38' function as the conduits 45 themselves in that the pedestal channels 38' contain the cooling liquid. The front and rear pedestal channels 38' may be provided to conduct cooling liquid at different temperatures. For instance, the front pedestal channel 38' could conduct cold cooling liquid while the rear pedestal channel 38' conducts heated cooling liquid, or vice-versa.

In this embodiment, each supporting pedestal 30 is a single integral component such that the supporting pedestal 30 is formed as a single component as opposed to various assembled components. In particular, in this embodiment, the supporting pedestals 30 are made of concrete. Notably, concrete is a material that performs well at handling compressive loads (which may not be the case for example for a metallic structure). As will be described in more detail below, the supporting pedestals 30 may also eliminate the need for a metallic upper frame which would otherwise be used to support conduits that route liquid through the data center 100. As such, the supporting pedestals 30 can help reduce the usage of metallic material.

As shown in FIG. 2, in some embodiments, floor panels 150 are installed between consecutive rows 12, above the ground surface GS, such that a majority of each of the supporting pedestals 30 is vertically lower than the floor panels 150. For instance, the floor panels 150 could be connected to the lowest ones of the stackable chassis 80 of the columns 14, or even to the supporting pedestals 30. The floor panels 150 thus provide a surface on which data center operators can circulate between the rows 12. In other embodiments, the upper surfaces 42 of the lower base portions 32 of the supporting pedestals 30 may form the surfaces on which the data center operators circulate between the rows 12.

Moreover, as shown in FIG. 2, in some embodiments, an upper zone 250 may be reserved above the rack columns 14 for a robotic rack handling system that can handle the rack assemblies 200.

It is contemplated that the supporting pedestals 30 may support more than one rack column 14 in other embodiments. For instance, the supporting pedestals 30 could be made longer and support two or three rack columns 14.

Furthermore, in some embodiments, as shown in FIG. 2, a plurality of row interconnectors 155 extend between consecutive ones of the rows 12 of racks 20. Notably, in this embodiment, the row interconnectors 155 are elongated members that are connected between the supporting chassis 80 of two server rack assemblies 200 of consecutive ones of the rows 12. That is, each row interconnector 155 is connected to the supporting chassis 80 of one server rack assembly 200 in a given row 12 and to the supporting chassis 80 of another server rack assembly 200 in a consecutive row 12. The row interconnectors 155 thereby minimize movement between the rows 12 which may be useful to make the rack system 10 more rigid as the consecutive rows 12 being linked to one another helps form a more stable structure. For instance, the row interconnectors 155 may be useful to resist instabilities caused by seismic activity or other factors that could cause movement of the rows 12.

It is contemplated that the server rack assemblies 200 and/or the stackable chassis 80 described above may be provided on their own, independently of the supporting pedestals 30. Thus, the server rack assembly 200 in accordance with some non-limiting implementations of the present technology can be represented as present in the following numbered clauses.

CLAUSE 1. A server rack assembly (200) for a data center (100), comprising: a stackable chassis (80) configured to support a plurality of servers, the stackable chassis comprising: a left side chassis portion (82L) defining a left end of the stackable chassis (80); and a right side chassis portion (82R) laterally spaced apart from the left side chassis portion (82L), the right side chassis portion (82R) defining a right end of the stackable chassis (80), the stackable chassis being configured to support the servers between the left and right side chassis portions (82L, 82R); and each of the left and right side chassis portions (82L, 82R) comprising: front and rear upper supports (86) configured to support an upper server rack assembly (200), the front and rear upper supports (86) being spaced apart from one another in a front-to-rear direction of the server rack (20); and front and rear lower supports (88) configured to be supported by a lower server rack assembly (200), the front and rear lower supports (88) being spaced apart from one another in the front-to-rear direction, the front and rear lower supports (88) being disposed vertically lower than the front and rear upper supports (86).

CLAUSE 2. The server rack assembly of clause 1, wherein: the server rack assembly further comprises a server rack (20) having a frame (21) and defining at least one housing section (22) for housing the plurality of servers therein; and the server rack (20) is connected to the stackable chassis (80), the server rack (20) being disposed between the left and right side chassis portions (82L, 82R).

CLAUSE 3. The server rack assembly of clause 1 or 2, wherein the stackable chassis (80) further comprises at least one lower chassis member (84) extending laterally and interconnecting the left and right side chassis portions (82L, 82R), the at least one lower chassis member (84) being disposed below the server rack (20).

CLAUSE 4. The server rack assembly of any one of clauses 1 to 3, wherein each of the left and right side chassis portions (82L, 82R) further comprises: a front upright member (90) connected to the front upper support (86) and the front lower support (88); a rear upright member (90) extending parallel to the front upright member (90), the rear upright member (90) being connected to the rear upper support (86) and the rear lower support (88); an upper longitudinal member (92) extending between the front and rear upper supports (86); and a lower longitudinal member (92) extending between the front and rear lower supports (88).

CLAUSE 5. The server rack assembly of any one of clauses 1 to 4, wherein each of the left and right side chassis portions (82L, 82R) further comprises at least one lateral connecting flange (96) configured to be connected to a laterally adjacent server rack assembly (200).

CLAUSE 6. The server rack assembly of clause 5, wherein the at least one lateral connecting flange (96) has a vertical surface (98) facing laterally outward.

CLAUSE 7. The server rack assembly of clauses 5 or 6, wherein, for each of the left and right side chassis portions (82L, 82R), the at least one lateral connecting flange (96) is disposed laterally outward of the front and rear upper supports (86).

CLAUSE 8. The server rack assembly of any one of clauses 5 to 7, wherein, for each of left and right side chassis portions (82L, 82R), the at least one lateral connecting flange (96) is disposed laterally outward of a part of a corresponding one of the left side chassis portion (82L) and the right side chassis portion (82R) extending between the front and rear upper supports (86) thereof.

CLAUSE 9. The server rack assembly of any one of clauses 1 to 8, wherein the stackable chassis has a width measuring between 1 and 3 meters inclusively.

CLAUSE 10. A rack system (10) for a data center (100) comprising: a plurality of server rack assemblies (200) configured according to any one of clauses 1 to 9, at least one rack row (12) being formed by at least some of the server rack assemblies (200), the at least one rack row (12) including a rack column (14) formed by a first server rack assembly (200) and a second server rack assembly (200) stacked atop the first server rack assembly (200), the lower supports (88) of the stackable chassis (80) of the second server rack assembly (200) being aligned with and supported by the upper supports (86) of the stackable chassis (80) of the first server rack assembly (200).

CLAUSE 11. The rack system of clause 10, wherein the lower supports (88) of the stackable chassis (80) of the second server rack assembly (200) are mated with the upper supports (86) of the stackable chassis (80) of the first server rack assembly (200).

CLAUSE 12. The rack system of clause 10 or 11, wherein: the rack column (14) includes a third server rack assembly (200), the first server rack assembly (200) being stacked atop the third server rack assembly (200) such that the lower supports (88) of the stackable chassis (80) of the first server rack assembly (200) are aligned with and supported by the upper supports (86) of the stackable chassis (80) of the third server rack assembly (200).

CLAUSE 13. The rack system of any one of clauses 10 to 12, wherein: the rack column (14) is a first rack column (14); the at least one rack row (12) includes a second rack column (14) laterally adjacent to the first rack column (14); one of the first server rack assembly (200) and the second server rack assembly (200) is laterally adjacent to an other server rack assembly (200) of the second rack column (14); and the stackable chassis (80) of the one of the first server rack assembly (200) and the second server rack assembly (200) is fastened to the stackable chassis (80) of the other server rack assembly (200).

CLAUSE 14. The rack system of clause 10, wherein: the at least rack row (12) includes a first rack row (12) and a second rack row (12), the second rack row (12) extending parallel to the first rack row (12) and being spaced therefrom; and the rack system (10) further comprises at least one row connector (155), each of the at least one row connector (155) interconnecting the stackable chassis (80) of a given one of the server rack assemblies (200) of the first rack row (12) with the stackable chassis (80) a given one of the server rack assemblies (200) of the second rack row (12) to minimize relative movement between the first rack row (12) and the second rack row (12).

Modifications and improvements to the above-described embodiments of the present technology may become apparent to those skilled in the art. The foregoing description is intended to be exemplary rather than limiting. The scope of the present technology is therefore intended to be limited solely by the scope of the appended claims.

What is claimed is:

1. A rack system for a data center, comprising:
   a plurality of server racks configured to house servers therein, each server rack being configured to store the servers which are accessible via a front side of the server rack, each server rack defining at least one housing section for receiving one or more of the servers therein;
   at least one rack column being formed by at least some of the server racks being disposed above one another, each server rack of the at least one rack column having a rack depth measured in a front-to-rear direction extending from the front side to a rear side of the server rack; and
   at least one supporting pedestal disposed below the at least one rack column in order to support the at least one rack column, the at least one supporting pedestal being configured to be positioned on a ground surface of the data center to distribute a load of the at least one rack column on the ground surface,
   each of the at least one supporting pedestal having a pedestal depth measured in the front-to-rear direction, the pedestal depth being greater than the rack depth,
   a ratio of the pedestal depth over the rack depth being between 1.2 and 2.5 inclusively,
   each server rack of the at least one rack column having a rack width measured in a lateral direction,
   each of the at least one supporting pedestal having a pedestal width measured in the lateral direction, the pedestal width being approximately the same as the rack width.

2. The rack system of claim 1, wherein each of the at least one supporting pedestal is made of concrete.

3. The rack system of claim 1, wherein each of the at least one supporting pedestal is a single integral component.

4. The rack system of claim 1, wherein:
   each of the at least one supporting pedestal defines a pedestal channel extending below a corresponding one of the at least one rack column;
   the pedestal channel extends generally laterally; and
   the pedestal channel extends along at least a majority of a width of the at least one supporting pedestal.

5. The rack system of claim 4, wherein the pedestal channel is open from a top thereof.

6. The rack system of claim 4, further comprising at least one conduit for servicing the servers stored by at least some of the server racks, the at least one conduit extending within the pedestal channel of the at least one supporting pedestal.

7. The rack system of claim 4, wherein:
   the pedestal channel is a first pedestal channel; and
   each of the at least one supporting pedestal defines a second pedestal channel extending generally parallel to the first pedestal channel.

8. The rack system of claim 7, wherein the first and second pedestal channels are configured to allow fluid flow therein such that the fluid is in contact with inner surfaces of the at least one supporting pedestal.

9. The rack system of claim 1, wherein each of the at least one supporting pedestal comprises:
a lower base portion defining the pedestal depth; and
an upper pillar portion extending upward from the lower base portion, the upper pillar portion having a pillar depth measured in the front-to-rear direction, the pillar depth being less than the pedestal depth.

10. The rack system of claim 9, wherein:
the upper pillar portion comprises two pillar walls extending upwardly from the lower base portion and spaced apart from one another in the front-to-rear direction; and
a distance between the two pillar walls is approximately equal to the rack depth.

11. The rack system of claim 9, wherein a bottom surface of the lower base portion extends along an entirety of the depth of the at least one supporting pedestal and the width of the at least one supporting pedestal.

12. The rack system of claim 1, wherein:
the at least one rack column includes a first rack column and a second rack column, the first rack column being laterally adjacent to the second rack column;
the rack system further comprises a rack row formed by the first and second rack columns;
the at least one supporting pedestal includes a first supporting pedestal and a second supporting pedestal, the first supporting pedestal supporting the first rack column, the second supporting pedestal supporting the second rack column.

13. The rack system of claim 12, wherein:
the at least one rack column includes a third rack column and a fourth rack column, the third rack column being laterally adjacent to the fourth rack column;
the rack row is a first rack row, the rack system further comprising a second rack row extending parallel to the first rack row, the second rack row being formed by the third and fourth rack columns, the third and fourth rack columns being spaced from the first and second rack columns; and
the at least one supporting pedestal includes a third supporting pedestal and a fourth supporting pedestal, the third supporting pedestal supporting the third rack column, the fourth supporting pedestal supporting the fourth rack column.

14. The rack system of claim 13, further comprising:
at least one floor panel extending between the first rack row and the second rack row, the at least one floor panel being disposed vertically higher than a bottom surface of the supporting pedestals.

* * * * *